(12) United States Patent
Gross et al.

(10) Patent No.: US 7,206,120 B2
(45) Date of Patent: Apr. 17, 2007

(54) DYNAMIC BEAM SPLITTER OUTPUTTING A SELECTABLE NUMBER OF BEAMS

(75) Inventors: Abraham Gross, Kamat Aviv (IL); Zvi Kotler, Tel Aviv (IL); Eliezer Lipman, Rishon Lezion (IL); Dan Alon, Mizpe Yericho (IL)

(73) Assignee: Orbtech Ltd., Tel Aviv (IL)

( * ) Notice: Subject to any disclaimer, the term of this patent is extended or adjusted under 35 U.S.C. 154(b) by 285 days.

(21) Appl. No.: 10/742,839

(22) Filed: Dec. 23, 2003

(65) Prior Publication Data

US 2005/0058175 A1 Mar. 17, 2005

Related U.S. Application Data

(62) Division of application No. 10/660,730, filed on Sep. 12, 2003.

(51) Int. Cl.
*G02F 1/33* (2006.01)

(52) U.S. Cl. .................. 359/305; 359/307; 359/308; 359/311; 359/312; 359/313; 359/314

(58) Field of Classification Search ............... 359/305, 359/307, 308, 311–314
See application file for complete search history.

(56) References Cited

U.S. PATENT DOCUMENTS

| | | | |
|---|---|---|---|
| 3,594,081 A | | 7/1971 | Tschink |
| 4,038,108 A | | 7/1977 | Engel et al. |
| 4,258,468 A | | 3/1981 | Balde |
| 4,279,472 A | | 7/1981 | Street |
| 4,443,066 A | * | 4/1984 | Freyre ................ 359/307 |
| 4,447,291 A | | 5/1984 | Schulte |
| 4,473,275 A | * | 9/1984 | David et al. ............ 359/307 |
| 4,624,534 A | * | 11/1986 | Amano ................ 359/310 |
| 4,697,888 A | * | 10/1987 | Schmadel et al. ......... 359/307 |
| 4,784,449 A | * | 11/1988 | Auracher et al. ........... 385/7 |
| 4,838,631 A | | 6/1989 | Chande et al. |
| 4,950,862 A | | 8/1990 | Kajikawa |
| 4,974,943 A | * | 12/1990 | Noguchi ............... 359/305 |
| 5,055,653 A | | 10/1991 | Funami et al. |
| 5,086,341 A | * | 2/1992 | Tamada et al. ........... 348/198 |
| 5,113,055 A | | 5/1992 | Kuriyama |

(Continued)

FOREIGN PATENT DOCUMENTS

EP        1224999        4/2001

(Continued)

OTHER PUBLICATIONS

U.S. Appl. No. 60/387,911, filed Jun. 2002, Gross et al.

(Continued)

*Primary Examiner*—Evelyn A. Lester
(74) *Attorney, Agent, or Firm*—Sughrue Mion, PLLC

(57) ABSTRACT

A dynamic beam splitter including a beam deflector having a plurality of operative regions, the beam deflector being operative to receive a laser beam at a first one of the plurality of operative regions, the laser beam passing through the beam deflector, and to selectably direct the laser beam in response to a control input signal to pass through the beam deflector a second time. Methods for splitting a beam and for manufacturing an electrical circuit employing the dynamic beam splitter are also enclosed.

18 Claims, 7 Drawing Sheets

U.S. PATENT DOCUMENTS

| | | | |
|---|---|---|---|
| 5,162,641 | A | 11/1992 | Fountain |
| 5,166,822 | A * | 11/1992 | Priatko et al. ............... 359/307 |
| 5,302,798 | A | 4/1994 | Inagawa et al. |
| 5,404,247 | A | 4/1995 | Cobb et al. |
| 5,408,553 | A | 4/1995 | English, Jr. et al. |
| 5,550,779 | A | 8/1996 | Burr et al. |
| 5,585,019 | A | 12/1996 | Gu et al. |
| 5,587,829 | A * | 12/1996 | Alexander et al. .......... 359/308 |
| 5,593,606 | A | 1/1997 | Owen et al. |
| 5,614,114 | A | 3/1997 | Owen |
| 5,624,437 | A | 4/1997 | Freeman et al. |
| 5,674,414 | A | 10/1997 | Schweizer |
| 5,676,866 | A | 10/1997 | In den Bäumen et al. |
| 5,690,845 | A | 11/1997 | Fuse |
| 5,776,573 | A | 7/1998 | Trotter et al. |
| 5,789,121 | A | 8/1998 | Cywar et al. |
| 5,841,099 | A | 11/1998 | Owen et al. |
| 5,933,216 | A | 8/1999 | Dunn |
| 5,948,288 | A | 9/1999 | Treves et al. |
| 5,948,291 | A | 9/1999 | Neylan et al. |
| 5,973,290 | A | 10/1999 | Noddin |
| 6,011,654 | A | 1/2000 | Schweizer et al. |
| 6,037,564 | A | 3/2000 | Tatah |
| 6,040,552 | A | 3/2000 | Jain et al. |
| 6,058,132 | A | 5/2000 | Iso et al. |
| 6,172,331 | B1 | 1/2001 | Chen |
| 6,184,490 | B1 | 2/2001 | Schweizer |
| 6,233,044 | B1 | 5/2001 | Brueck et al. |
| 6,252,667 | B1 | 6/2001 | Hill et al. |
| 6,295,171 | B1 | 9/2001 | Chao et al. |
| 6,310,701 | B1 | 10/2001 | Lizotte |
| 6,313,918 | B1 | 11/2001 | Hill et al. |
| 6,420,675 | B1 | 7/2002 | Lizotte et al. |
| 6,483,071 | B1 | 11/2002 | Hunter et al. |
| 6,491,361 | B1 | 12/2002 | Spann |
| 6,515,257 | B1 | 2/2003 | Jain et al. |
| 6,566,627 | B2 | 5/2003 | Brandinger et al. |
| 6,573,473 | B2 | 6/2003 | Hunter et al. |
| 6,751,009 | B2 | 6/2004 | Khoshnevisan et al. |
| 2002/0189330 | A1 | 12/2002 | Mancevski et al. |
| 2003/0019854 | A1 | 1/2003 | Gross et al. |
| 2003/0168434 | A1 | 9/2003 | Gross et al. |
| 2004/0113059 | A1 | 6/2004 | Kawano et al. |
| 2004/0183009 | A1 | 9/2004 | Reilly et al. |
| 2004/0196559 | A1 | 10/2004 | Lissotschenko |
| 2005/0061981 | A1 | 3/2005 | Allen et al. |

FOREIGN PATENT DOCUMENTS

| | | | |
|---|---|---|---|
| GB | 2248684 A * | 4/1992 | ................. 359/305 |
| WO | WO 0064623 | 11/2000 | |
| WO | WO 03071344 | 8/2003 | |

OTHER PUBLICATIONS

Mignardi et al. "The Digital Micromirror Device—a Micro-Optical Electromechanical Device for Display Applications", MEMS and MOEMS Technology and Applications, SPIE Press, 2000.

Owen, Mark, New Technology for Drilling Through -and Blind- Vias in Copper Clad Reinforced Circuit Boards, IPC Proceedings, May 1995.

Lee, Rex A. and Moreno, W.A., Excimer vs. ND:YAG Laser Creation of Silicon Vias for 3D Interconnects, IEEE, 1992, pp. 358-360.

"Dopant-Induced Excimer Laser Ablation of Poly(tetrafluoroethylene)," Applied Physics B:Photo-Physics and Laser Chemistry, Mar. 92, vol. b54, No. 3, C R Davis et al, pp. 227-230.

"Etch-Stop Polymer Machining with an Argon Ion Laser," IBM Technical Disclosure Bulletin, Jan. 1993, vol. 36., No. 1, Armonk, NY, US, p. 254.

Pete Singer, "The Interconnect Challenge: Filling Small, High Aspects Ratio Contact Holes," Semiconductor International, Aug. 1994, pp. 57-64.

"Printed Circuit Operations—A View from Inside," Unisys.

Richard Harris et al., "MCM Micromachining: Nd:YAG UV Laser Process is a New Option," Electro Scientific Industries, Inc., Spring 1993.

"LaserPulse," Electro Scientific Industries, Inc., Fall 1993, pp. 1-7.

Y. S. Liu, "Laser Metal Deposition for High-Density Interconnect," Optics & Photonics News, Jun. 1992, pp. 10-14.

Friedrich G. Bachmann, "Large scale industrial application for excimer-lasers; via-hole-drilling by Photo-ablation," SPIE, vol. 1361, Physical Concepts of Materials for Novel Optoelectronic Device Applications, 1990, pp. 500-511.

Hans-Ulrich Krebs and Olaf Bremert "Pulsed laser deposition of thin metallic alloys", Applied Physics Letters vol. 62(19) pp. 2341-2343. May 10, 1993.

Brannon, J.H., "Excimer-Laser Ablation and Etching," Circuits & Devices magazine, Sep. 1990 pp. 19-24.

Cole, H.S., Liu, Y.S., and Philipp, H.R., "Dependence of photoetching rates of polymers at 193 nm on optical absorption depth," Appl. Phys. Lett., vol. 48, No. 1, Jan. 6, 1986, pp. 76-77.

Dyer, P.E., and Sidhu, J., "Spectroscopic and fast photographic studies of excimer laser polymer ablation," J. Appl. Phys. 64 (9), Nov. 1, 1988, pp. 4657-4663.

4420 Laser Micromachining System -ESI Brochure (2 pages), Sep. 1993.

Ewing, J.J., "Advanced solid-state lasers challenge conventional types," Laser Focus World, Nov. 1993, pp. 105-110.

Hobbs, Jerry R., "Electronics makers switch to precise micromachining tools," Laser Focus World, Mar. 1994, pp. 69-72.

Lee, Rex A. and Moreno, W.A., Excimer vs. ND:YAG Laser Creation of Silion Vias for 3D Interconnects, IEEE, 1992, pp. 358-360.

Liu, Y.S., Cole, H.S., and Guida, R., "Laser ablation of polymers for high-density interconnect," Microelectronic Engineering 20 (1993) 15-29, 1993 Elsevier Science Publishers B. V., pp. 15-29.

Mahan, G.D., et al. "Theory of polymer ablation," Appl. Phys. Lett. 53 (24), Dec. 12, 1988, pp. 2377-2379.

Owen, Mark, New Technology for Drilling Through -and Blind- Vias in Copper Clad Reinforced Circuit Boards, IPC Proceedings, May 1995.

Srinivasan, R., and Braren R., "Ultraviolet Laser Ablation of Organic Polymers," Chemical Reviews, 1989, vol. 89, No. 6.

Tessier, Theodore G. and Chandler, Jerry, "Compatibility of Common MCM-D Dielectric with Scanning Laser Ablation Via Generation Processes," IEEE (1993), pp. 39-45.

"Trepanning Moves in on Mini Holes," Machinery and Production Engineering, Nov. 2, 1983, pp. 42-43.

Wiener-Avnear, Eli, "Lasers cut microscopic paths with major potential," Laser Focus World, Jul. 1993, pp. 75-80.

Wu et al., "Single-Shot Excimer Laser Ablation of Thick Polymar Desists on Metallic Substrates," AMP Journal of Technology, vol. 1, Nov. 1991, 69-79.

Martyniuk J., "UV Laser-Assisted Wire Stripping and Micromachining", AMP Journal of Technolgy, vol. 4, Jun. 1995.

"Laser-Induced Plated Through-Holes," IBM Technical, Disclosure Bulletin, Oct. 1968, vol. 11, No. 5, H.R. Potts and C.A. Speicher, p. 540.

ESI "Model 4570 Series Lasers Service Guide", Feb. 1994.

* cited by examiner

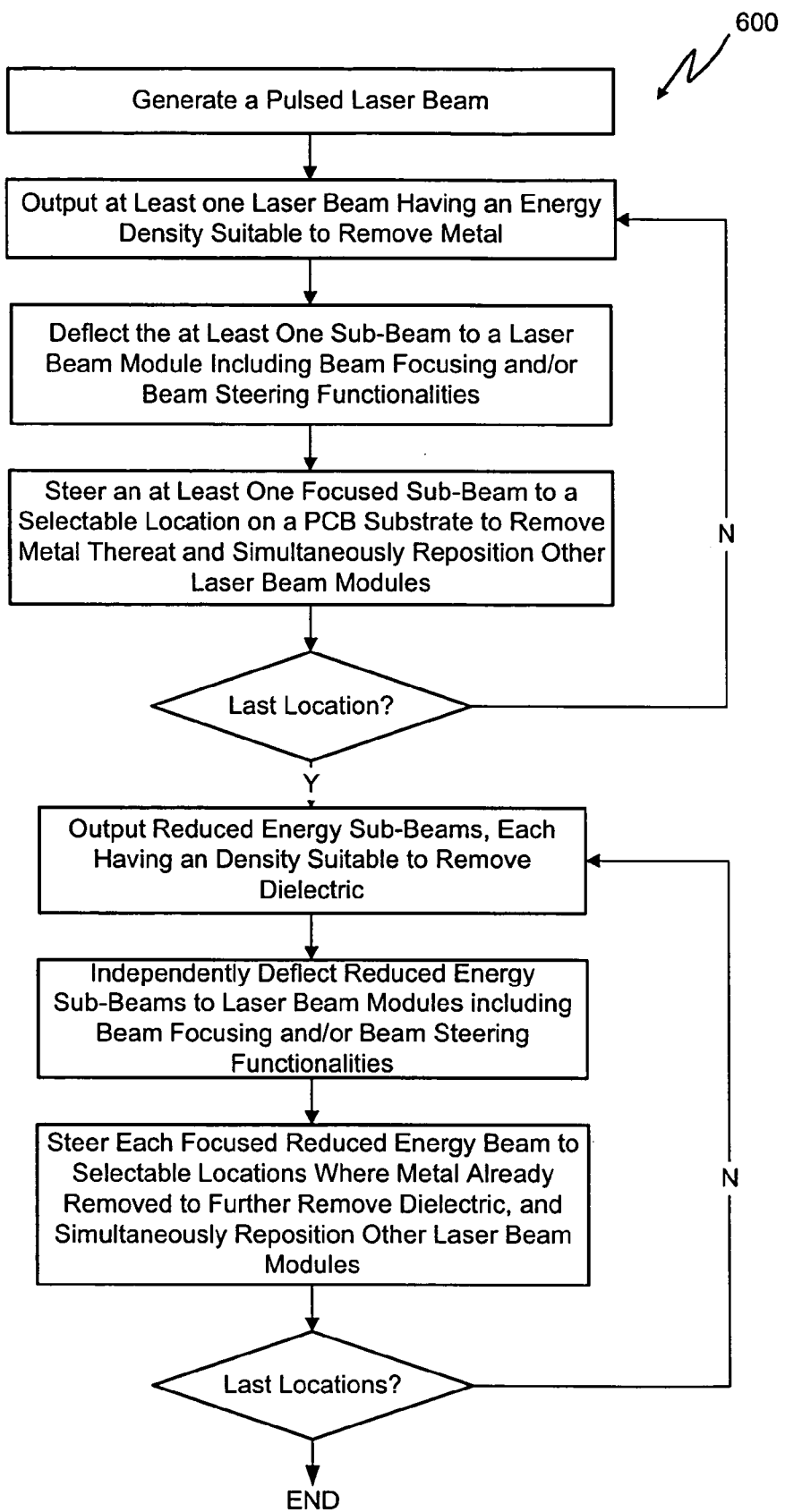

DYNAMIC BEAM SPLITTER OUTPUTTING A SELECTABLE NUMBER OF BEAMS

This is a division of application Ser. No. 10/660,730 filed Sep. 12, 2003. The above noted prior application is hereby incorporated by reference in its entirety.

FIELD OF THE INVENTION

The present invention generally relates to multiple laser beam positioning and energy deliver systems, and more particularly to laser micro-machining systems employed to form holes in electrical circuit substrates.

BACKGROUND OF THE INVENTION

Various laser systems are employed to micro-machine and otherwise thermally process substrates. Conventional laser systems employ focusing optics positioned between a beam steering device and a substrate to focus the beam onto the substrate.

A laser micro-machining device employing multiple independently positionable laser beams is described in copending U.S. patent application Ser. No. 10/170,212, filed Jun. 13, 2002 and entitled "Multiple Beam Micro-Machining System and Method", the disclosure of which is incorporated by reference in its entirety.

A laser device employing multiple independently positionable laser beams for thermally treating thin film materials, for example thin films on flat panel display substrates, is described in copending PCT application PCT/IL03/00142, filed Feb. 24, 2003 and entitled "Method for Manufacturing Flat Panel Display Substrates", the disclosure of which is incorporated by reference in its entirety.

SUMMARY OF INVENTION

The present invention seeks to provide an improved multiple beam laser beam energy delivery system, for simultaneously delivering multiple beams of focused laser energy to a substrate, that avoids the use of an f-θ scan lens.

The present invention further seeks to provide an improved multiple beam laser beam energy delivery system, for simultaneously delivering multiple beams of focused laser energy to a substrate, that avoids focusing optics situated between a beam steering device and the substrate.

The present invention still further seeks to provide an improved multiple beam laser beam energy delivery system, for delivering multiple beams of laser energy to a substrate, that independently focuses each of the multiple laser beams. In accordance with an embodiment of the invention, each of the multiple laser beams is independently focused upstream of a beam steering assembly.

The present invention still further seeks to provide an integrated multiple laser beam energy delivery system, for delivering multiple beams of laser energy to a substrate, operative to independently steer each of the laser beams, and to independently focus each of the laser beams in coordination with the beam steering.

The present invention still further seeks to provide a multiple laser beam laser energy delivery system operative to deliver laser energy to independently selectable locations on a workpiece, the device having an array of beam steering modules located downstream of beam focusing optics. In accordance with an embodiment of the present invention, the beam focusing optics are operative to independently focus each of the multiple laser beams onto a selectable location.

The present invention still further seeks to provide a multiple laser beam energy delivery system, for delivering multiple beams of laser energy to a workpiece, having a redundant number of independent focusing modules relative to a number of laser beams. The system is operative to use some focusing modules to deliver focused laser beams to a first set of locations on the substrate and to simultaneously move other focusing modules into focus to subsequently deliver focused laser beams to a second set of locations on the substrate. In accordance with an embodiment of the invention, the time required to move a focusing module into focus is greater than the time required to select a focusing module. The time required to switch between focusing modules is less than the time interval between adjacent pulses.

The present invention still further seeks to provide an improved multiple beam laser beam energy delivery system, for delivering multiple beams of laser energy to a workpiece, that includes a quantity laser beam focusing modules that is greater than the quantity of laser beams, and a beam director that is used to direct each beam to a selectable focusing module. While delivering focused laser energy to a first set of selectable locations on a substrate via a first set of laser beam focusing modules, other laser beam focusing modules are moved into focus for later delivery of focused laser energy to a next different of selectable locations.

There is thus provided in accordance with an embodiment of the present invention and apparatus and method for delivering laser energy to a workpiece, including at least one laser energy source providing at least one laser beam; and a plurality of laser beam modules arranged to selectably steer the at least one laser beam to a plurality of target sub-areas on a workpiece, which together cover a target area, the plurality of laser beam modules being additionally operative to focus the at least one laser beam on the workpiece without an intervening f-theta lens.

There is thus provided in accordance with another embodiment of the present invention an apparatus and method for delivering laser energy to a workpiece, including at least one pulsed laser energy source operating at a pulse repetition rate and providing at least one pulsed laser beam; and a plurality of laser beam focusing optical modules arranged to selectably focus each of the at least one laser beam to a selected location on a workpiece, the plurality of laser beam focusing optical modules being of a number greater than the at least one laser beam, thereby to define at least one redundant laser beam focusing optical module.

There is thus provided in accordance with still another embodiment of the present invention an apparatus and method for delivering laser energy to a workpiece, including at least one laser energy source providing at least one laser beam; a plurality of laser beam steering modules arranged to selectably steer the at least one laser beam to selectable locations on a target; and a plurality of laser beam focusing optical modules associated with the laser beam steering modules for focusing a laser beam onto the workpiece.

There is thus provided in accordance with still another embodiment of the present invention an apparatus and method for delivering laser energy to workpiece, including a laser energy source providing at least two laser beams for delivering laser energy to a workpiece at least at two different locations; at least two optical elements receiving the at least two laser beams, the at least two optical elements being operative to simultaneously independently control a beam parameter of each of the at least two laser beams; and a laser beam steering assembly receiving the at least two laser beams and being operative to independently steer the at least two laser beams to independently selectable locations on an in-fabrication electrical circuit.

There is thus provided in accordance with still another embodiment of the present invention an apparatus and method for delivering laser energy to an electrical circuit substrate, including at least one laser beam source simultaneously outputting a plurality of laser beams; a plurality of independently steerable laser beam deflectors disposed between the at least one laser beam source and the electrical circuit substrate to direct the plurality of laser beams to impinge on the electrical circuit substrate at independently selectable locations; and focusing optics operative to focus the plurality of laser beams to different independently selectable locations without f-θ optical elements.

There is thus provided in accordance with still another embodiment of the present invention an apparatus and method for delivering laser energy to a substrate including: at least one pulsed laser energy source providing at least one pulsed laser beam; a plurality of laser beam steering modules arranged to selectably steer the at least one laser beam to selected locations on a target at differing focal lengths, the plurality of laser beam steering modules being of a number greater than the at least one laser beam, thereby to define at least one redundant beam steering module; a plurality of laser beam automatic focusing optical modules upstream of the plurality of laser beam steering modules for automatically focusing a laser beam passing therethrough to a corresponding laser beam director module, to compensate for the differing focal lengths, the plurality of laser beam automatic focusing optical being of a number greater than the at least one laser beam, thereby to define at least one redundant laser beam automatic focusing optical module, the redundancy in the plurality of laser beam director modules and the plurality of laser beam automatic focusing optical modules compensating for a difference between a pulse repetition rate of the at least one pulsed laser energy source and a cycle time of the automatic focusing optical module.

Various embodiments of the invention include one or more of the following features and characteristics. It is noted, however, that some of the following components, features and characteristics may be found alone or in combination with other features and characteristics; some of the following components, features and characteristics refine others; and the implementation of some of the following components, features and characteristics excludes implementation of other components, features and characteristics.

A laser energy source comprises a laser and a laser beam splitter operative to convert an output of the laser into a plurality of laser beams.

A laser energy source comprises a laser and a laser beam director operative to receive an output of the laser and to provide a plurality of individually directed laser beams.

A beam splitter is operative to receive a laser beam and to output each of at least two laser beams in independently selectable directions.

A laser energy source comprises a laser and an AOD (acousto-optical device) operative to split an output of the laser into a selectable number of laser beams and to individually direct each laser beam to a selectable location.

Laser beam modules comprise at least one laser beam steering module operative to steer at least one laser beam to a selectable location on the workpiece, and at least one laser beam focusing optical module upstream of the at least one laser beam steering module operative to focus the at least one laser beam onto the workpiece.

Optionally, laser beam modules comprise at least one laser beam steering module operative to steer at least one laser beam to a selectable location on the workpiece and to selectively extend or retract to compensate for an actual distance to the selectable location to thereby deliver the at least one laser beam in focus onto the workpiece.

Laser beam modules comprise a plurality of laser beam steering modules arranged in an array, each laser beam steering module being operative to steer a laser beam to a selectable location in a corresponding target sub-area.

Each laser beam steering module is operative to steer a laser beam to a selectable location independent of other laser beam steering modules.

Laser beam focusing optical modules operate in coordination with a corresponding laser beam steering module, the focusing optical modules being operative to focus a laser beam onto the workpiece at a selectable location.

Laser beam modules comprise a plurality of laser beam steering modules and a corresponding plurality of laser beam focusing optical modules. Each laser beam focusing optical module is operative to focus a laser beam to any selectable location in a target sub-area.

The laser beam modules include at least one redundant laser beam module.

The laser beam is a pulsed laser beam. During an initial pulse, a first laser beam steering module is operative to steer a laser beam in focus to a first selectable location. During a subsequent pulse, a second laser beam steering module is operative to steer at least one laser beam in focus to a second selectable location different from the first selectable location.

A laser beam steering module is arranged to selectably steer a laser beam to a selectable location in a target sub-area. At least some selectable locations in the target sub-area are located at differing focusing distances from a corresponding focusing optical module. Focusing is achieved by dynamically changing a focus parameter of the focusing optical module.

A laser beam can be selectably directed to a selectable laser beam focusing optical module. A redundancy in the laser beam focusing optical modules respective of the laser beams compensates for a difference between the pulse repetition rate and a cycle time of each of the laser beam focusing optical modules.

During a first pulse of the pulsed laser energy source, a first laser beam focusing optical module is operative to focus a first pulsed laser beam onto a workpiece.

During a first pulse of the pulsed laser source, a redundant laser beam focusing optical module is repositioned to a position required to focus a subsequent pulsed laser beam onto the workpiece at a subsequent selectable location, the subsequent pulsed laser beam being output during a subsequent pulse of the pulsed laser energy source.

A pulsed laser energy source is operative to provide a plurality of pulsed laser beams during each pulse.

A pulsed laser energy source is operative to provide a plurality of pulsed laser beams for each pulse, and the plurality of laser beam focusing optical modules includes an at least one redundant laser beam focusing optical module respective of each laser beam.

A cycle time for configuring a laser beam focusing optical module to focus a laser beam onto the workpiece exceeds a time interval separating pulses of the at least one pulsed laser source.

A pulsed laser energy source comprises a deflector selectably deflecting the at least one pulsed laser beam. A cycle time of the deflector is less than a time interval between pulses of the pulsed laser source.

During an initial pulse of the pulsed laser energy source the deflector is operative to deflect an initial laser beam to a first laser beam focusing optical module, and during a next pulse the deflector is operative to deflect a next laser output to a redundant laser beam focusing optical module.

A plurality of laser beam steering modules is provided downstream of the plurality of laser beam focusing optical modules for steering a laser beam to a selectable location on the workpiece.

Laser beam focusing modules include a selectively pivoting mirror operative to be extended or retracted to compensate for changes in distance to a flat surface resulting from a pivoting action.

A laser beam focusing module comprises at least one actuator operative to move a portion of the laser beam steering module to compensate for changes in a length of an optical path as a function of steering the at least one laser beam.

A pulsed laser comprises a Q-switched pulsed laser.

A pulsed laser outputs a laser beam in the ultra-violet spectrum.

A laser beam steering assembly comprises a plurality of laser beam steering modules. The laser beam steering modules is arranged in a two dimensional array of laser beam steering modules.

A focusing assembly comprises at least two dynamically movable optical elements arranged in an array of lens modules.

A changeable beam parameter is a focus parameter. Focusing modules are operative to simultaneously independently focus at least two laser beams at respective independently selectable locations. The at least two laser beams are derived from the same laser beam source.

An array of focusing modules is disposed between the laser beam source and a laser beam steering assembly.

A focusing module comprises at least one lens element being independently movable respective of a movable lens element in another focusing module.

A controller is operative to independently move movable lens elements to independently focus at least two laser beams at respective independently selectable locations.

A zoom lens element is operative to receive at least two laser beams and to change a beam diameter property of the laser beams.

A laser beam is deliverable in focus to an independently selectable location among a plurality of selectable locations within a target sub-area. At least some of the independently selectable locations have different focus parameters. Focus is achieved by independently dynamically focusing each of the beams.

Focusing modules are operative to focus each laser beams at an independently selectable location as a function of a corresponding focusing distance.

A beam steering assembly comprises at least two actuators each coupled to a reflector to independently pivot each reflector. The actuators are further operative to extend or retract each reflector to independently adjust a beam focus parameter of the at least two laser beams.

The laser beams are operative to deliver laser energy to generate a via hole in an in-fabrication electrical circuit.

The laser beams are operative to deliver laser energy to trim a passive electrical component in an in-fabrication electrical circuit.

An in-fabrication electrical circuit is an in-fabrication printed circuit board, in-fabrication integrated circuit, an in-fabrication flat panel display.

The laser beams are operative to deliver laser energy to anneal silicon in an in-fabrication electrical circuit, such as an in-fabrication flat panel display.

The laser beams are operative to deliver laser energy to facilitate ion implantation in an in-fabrication electrical circuit, such as in-fabrication integrated circuit or in-fabrication flat panel display.

There is thus provided in accordance with still another embodiment of the present invention an apparatus and method for dynamically splitting a laser beam, including a beam deflector having a plurality of operative regions, the beam deflector being operative to receive a laser beam at a first one of the plurality of operative regions and to provide a selectable number of output beam segments in response to a control input signal.

There is thus provided in accordance with still another embodiment of the present invention an apparatus and method for dynamically deflecting a laser beam, including a beam deflector element having a plurality of operative regions, the beam deflector element being operative to receive an input laser beam at a first one of the plurality of operative regions and to provide a plurality of output beam segments output at least from one additional operative region, at least one output beam being independently deflected in response to a first control input signal.

There is thus provided in accordance with still another embodiment of the present invention an apparatus and method for dynamically splitting a laser beam, including a beam deflector having a plurality of operative regions being operative to receive a laser beam at a first one of the operative regions; and further being responsive to a control input signal to generate a selectable number of output beam segments, at least one output beam being output from a second operative region.

Various embodiments of these aspects of the invention include one or more of the following features and characteristics. It is noted, however, that some of the following components, features and characteristics may be found alone or in combination with other features and characteristics; some of the following components, features and characteristics refine others; and the implementation of some of the following components, features and characteristics excludes implementation of other components, features and characteristics.

A control input signal controlling the beam splitter/deflector comprises a sequence of pulses, each of the pulses controlling a respective output beam segments.

Each of the output beams has an energy parameter that is controlled by a characteristic of the control input signal.

Each of the output beam segments is deflected by a respective deflection angle that is controlled by a characteristic of a pulse in the control input signal.

Each of the output beam segments has substantially the same cross sectional configuration, irrespective of the selectable number of output beam segments.

The selectable number of output beam segments have a controllable energy parameter. The energy parameter is an energy density or fluence.

The energy densities among output beam segments is selectable to be substantially uniform. Optionally, it is selectable to be substantially not uniform.

The beam deflector is operative to direct the output beam segments in respective selectable directions responsive to the control input signal.

The beam deflector comprises an acousto-optic deflector, and a transducer to generate acoustic waves in the acousto-optic deflector in response to the control input signal. The deflector diffracts the laser beam at each of several operative regions as a function of the acoustic wave formed by the control input signal.

A beam redirector is operative to receive an output beam segment directed in a second direction from a first one of the plurality of operative regions and to direct the output beam segment to second ones of the plurality of operative regions.

A beam redirector comprises a first mirror having a plurality of regions, each region passing to the operative regions of a beam splitter/deflector a portion of a redirected beam and reflecting to a parallel mirror a remaining portion of the redirected beam.

Beam segments output by the beam reflector/deflector are mutually non-parallel.

An input laser beam has a spatial cross-section in the first one of the plurality of operative regions. A beam redirector comprises correction optics, which operate on redirected output beam segment so that the spatial cross section of the redirected output beam segment is substantially similar to the spatial cross section of the input beam.

A control input signal has a frequency characteristic, which controls the beam direction, and an amplitude characteristic, which controls an energy parameter of an output beam.

Each of the above devices and methods may be employed as part of process for manufacturing electrical circuits in which laser energy is delivered to an electrical circuit substrate, for example to ablate a material at a selected location, or as part of an annealing or ion implantation process. An additional electrical circuit manufacturing operation, such as, but not limited to, an additional photo-lithography, etching or metal deposition process, typically is performed on the electrical circuit substrate.

BRIEF DESCRIPTION OF DRAWINGS

The present invention will be understood and appreciated more fully from the following detailed description, taken in conjunction with the drawings in which:

FIG. 4 is a flow diagram of a method for manufacturing electrical circuits in accordance with an embodiment of the invention.

DETAILED DESCRIPTION OF PREFERRED EMBODIMENTS

Figures 1A, 1B:
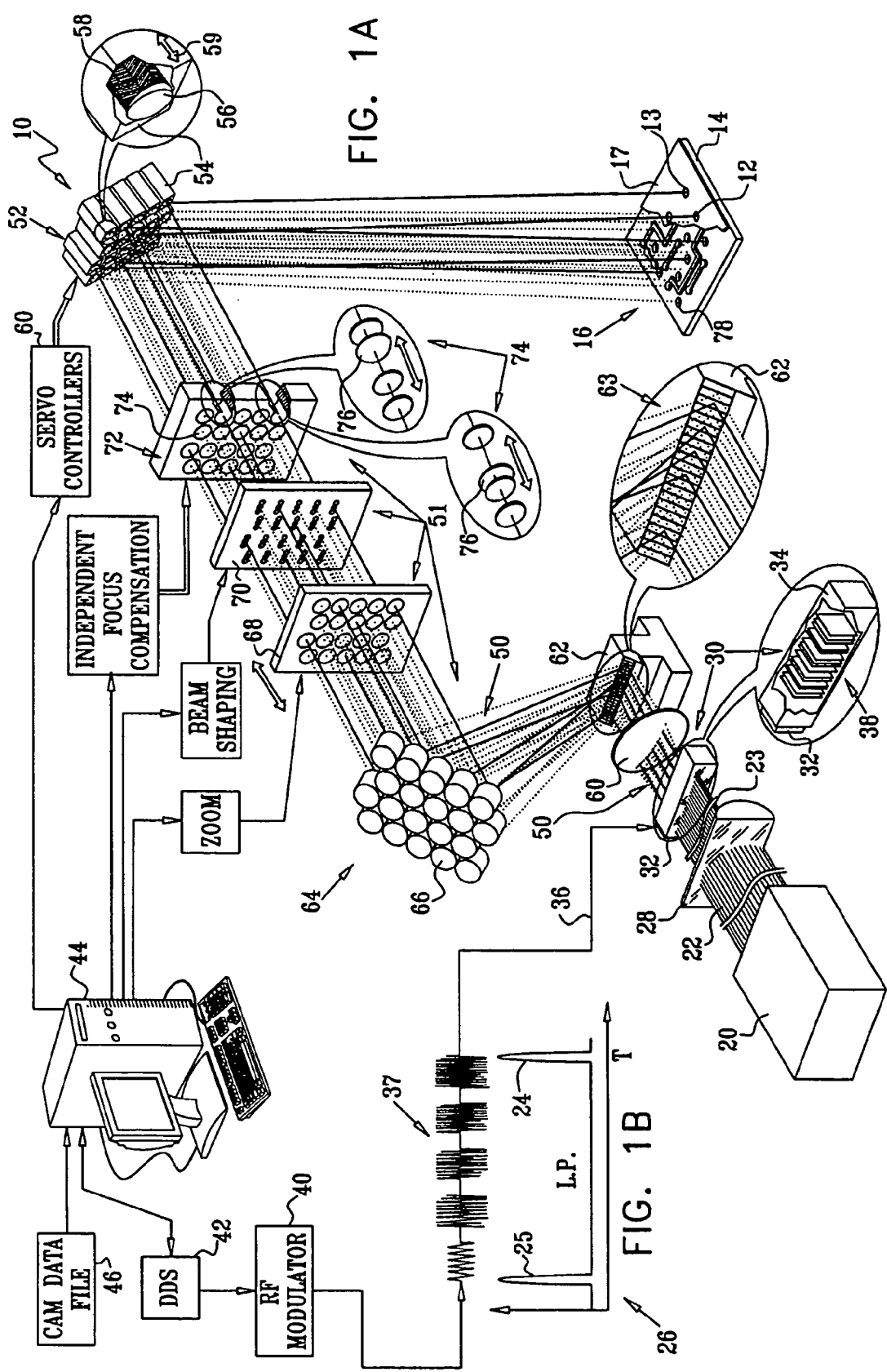
FIG. 1A is a simplified partially pictorial, partially block diagram, illustration of apparatus for fabricating electrical circuits constructed and operative in accordance with a preferred embodiment of the present invention.
FIG. 1B is a timing graph of laser pulses output by a laser used in the system and functionality of FIG. 1.

Reference is now made to FIG. 1A, which is a simplified partially pictorial, partially block diagram, illustration of a system and functionality for fabricating an electrical circuit, constructed and operative in accordance with a preferred embodiment of the present invention, and to FIG. 1B which is a timing graph of laser pulses output by a laser used in the system and functionality of FIG. 1A. The system seen in FIG. 1A includes laser micro-machining apparatus 10, which in general terms is operative to simultaneously deliver multiple beams of energy to a workpiece, such as an electrical circuit substrate.

Apparatus 10 is particularly useful in the context of micro-machining holes, such as vias 12, at locations 13, in printed circuit board substrates 14, during the fabrication of printed circuit boards. Apparatus 10 may be adapted without departing from the presently described invention for use in other suitable fabrication processes employing micro-machining or heat treating of substrates. These processes include, without limitation, the selective annealing of amorphous silicon in flat panel displays, selective laser assisted doping of semiconductor transistors such as thin film transistors on flat panel displays, the removal of solder masks from electrical circuits, and the trimming of passive electronic components, such as imbedded resistors in printed circuit boards and bumps on ball grid array substrates and "flip-chip" type semiconductor circuits. Accordingly, although the invention is described in the context of micro-machining printed circuit boards, the scope of the invention should not be limited solely to this application.

Printed circuit board substrates, such as a substrate 14, which are suitable to be micro-machined using systems and methods described hereinbelow, typically include dielectric substrates, for example epoxy glass, having one or more electrical circuit layers. Typically, a conductor pattern 16 is selectively formed on each electrical circuit layer. The substrates may be formed of a single layer or, in the alternative, of a laminate including several substrate layers adhered together. Additionally, the outermost layer of the substrate 14 may comprise the conductor pattern 16 formed thereon, as seen in FIG. 1A. Alternatively, the outermost layer of substrate 14 may comprise, for example, a metal foil substantially overlaying a continuous portion of the outer surface of the substrate 14, for example as shown by the region indicated by reference numeral 17. In the context of other related applications, substrate 14 may be, for example, an in-fabrication flat panel display.

In accordance with an embodiment of the invention, as seen in FIG. 1A, laser micro-machining apparatus 10 includes a pulsed laser 20 outputting a pulsed laser beam 22. Pulsed laser beam 22 is defined by a stream of light pulses, schematically indicated by peaks 24 and 25 in laser pulse graph 26 (FIG. 1B). In accordance with an embodiment of the invention pulsed laser 20 is a frequency tripled Q-switched YAG laser providing a pulsed a UV laser beam 22 at a pulse repetition rate of between about 10–100 KHz, and preferably at about 10–30 KHz. Suitable Q-switched lasers are presently available, for example, from Spectra Physics, Lightwave Electronics and Coherent, Inc. all of California, U.S.A. Other commercially available pulsed lasers, that suitably interact with typical materials employed to manufacture printed circuit boards, may also be used.

Another suitable laser for use as pulsed laser 20, operative to output a pulsed UV laser beam particularly suitable for micro-machining substrates containing glass, is described in the present Applicants' copending U.S. patent application Ser. No. 10/167,472, now U.S. Pat. No. 6,756,563, the disclosure of which is incorporated by reference in its entirety.

In the embodiment seen in FIG. 1A, pulsed laser beam 22 impinges on a first lens 28, such as a cylindrical lens, operative to flatten beam 22 into a narrow beam 23 having a waist which is delivered to an image plane (not seen) in a first variable deflector assembly, such as an acousto-optical deflector (AOD) 30. Preferably AOD 30 includes a transducer element 32 and a translucent crystal member 34 formed of quartz or other suitable crystalline material.

It is noted that various design details of micro-machining apparatus 10 seen in FIG. 1A, which are well within the competence of a skilled optical designer, are omitted in an effort to maintain clarity and avoid obscuring key teaching points of the invention. For example, various lenses and optical paths are not drawn to scale. Moreover, some lenses, for example (but not limited to) lens 28, include several separate lens elements which are not shown. Likewise beam stabilization means within the competence of a skilled optical designer, as typically would be required in a complex laser energy delivery system, are omitted from the drawings to maintain clarity and avoid obscuring key teaching points of the invention.

Returning now to FIG. 1A, transducer 32 receives a control signal 36 and generates an acoustic wave 38 that propagates through crystal member 34 of AOD 30. Control signal 36 preferably is an RF signal provided by an RF modulator 40, preferably driven by a direct digital synthesizer (DDS) 42, or other suitable signal generator, for example a voltage controlled oscillator (VCO). A system controller 44, in operative communication with DDS 42 and a laser driver (not shown), is provided to coordinate between generation of the control signal 36 and laser pulses 24 defining pulsed laser beam 22 so that portions of substrate 14 are removed, e.g. by ablation, in accordance with a desired design pattern of an electrical circuit to be manufactured. Such design pattern may be provided, for example, by a CAD or CAM (computer aided design or computer aided manufacture) data file 46 or other suitable computer file representation of an electrical circuit to be manufactured.

In some applications, pulsed laser beam 24 is delivered to substrate 14 to heat portions of the substrate without ablation, for example for use in laser assisted annealing of amorphous silicon or laser assisted ion implantation in thin film transistors, for example as described in Applicants' copending U.S. patent application Ser. No. 10/170,212, filed Jun. 13, 2002 and entitled "Multiple Beam Micro-Machining System and Method", and copending PCT application PCT/IL03/00142, filed Feb. 24, 2003 and entitled "Method for Manufacturing Flat Panel Display Substrates", the disclosures of which are incorporated by reference in their entirety.

As known in the art, presence of the acoustic wave 38 in crystal member 34, when beam 23 impinges thereon, causes beam 23 to be deflected at an angle $\theta_n$, relative to an axis incidental with an axis of an input beam, which is a function of the frequency $f_n$ of wave 38, according to the formula:

$$\theta_n = \frac{\Delta f_n \times \lambda}{v_s}$$

Where:

$\Delta f_n = f_n - f_0$;

$\lambda$=wavelength of beam 22;

$v_s$=speed of sound in the crystal 34 of AOD 30, and n is an integer representing the index number of a laser sub-beam, as described hereinbelow.

In accordance with an embodiment of the invention, AOD 30 is operative to function as a dynamic beam splitter and beam deflector which governs at least one of: a number segments into which beam 23 is split and an angle of deflection of each segment. Signal 36 may be selectably provided so as to cause acoustic wave 38 to propagate at a uniform frequency through an active portion of crystal member 34. Alternatively, signal 36 may be selectably provided so as to cause the acoustic wave 38 to propagate with different frequencies in the active portion of crystal member 34.

In accordance with an embodiment of the invention, signal 36 causes the acoustic wave 38 to be generated in AOD 30 with different frequencies such that at a moment in time at which the acoustic wave 38 interacts with a laser pulse 24 in laser beam 23, the acoustic wave 38 comprises at least two different frequency components. These components may constitute, for example at least two different superimposed frequencies, or two spatially separated regions each with the same frequency. By generating an acoustic wave 38 with more than one frequency component, segmentation of beam 23 and the respective directions at which each segment is output from the AOD 30 are controlled. Typically, signal 36 comprises a sequence of pulses 37 which are timed so that the resulting different frequency components in acoustic wave 38 are spatially separated in AOD 30 at the moment at which a laser pulse 24 or 25 in beam 23 impinges thereon. Alternatively, the different frequencies are superimposed in a complex waveform having spatially overlapping frequency components (not shown).

In accordance with an embodiment of the invention, the acoustic wave 38 is propagated through crystal member 34 in a non-uniform waveform and interacts with the laser beam 23 so that beam 23 is segmented into at least two beam segments 50, or sub-beams.

Beam segments 50 are depicted in FIG. 1A as being solid lines. As will be described in greater detail hereinbelow, beam segments 50 may propagate along any of several different beam paths, designated beam paths 51. Paths that are not occupied by a beam segment 50 are depicted in FIG. 1A as dotted lines. Each of the beam segments 50 preferably is independently deflected at an angle $\theta_n$ which is a function of an acoustic wave frequency, or frequencies, of the acoustic wave 38 in crystal member 34 at the time a pulse in the laser beam 23 impinges thereon.

Each of beam segments 50, whether a single segment, provided e.g. by an acoustic wave having only one frequency, or several segments as seen in FIG. 1A provided e.g. by an acoustic wave having several different frequencies along its, length, is directed to impinge on a variable deflector assembly 52. The variable deflector assembly 52 comprises an array of beam steering modules 54. Each module includes an independently tiltable reflector element 56 and an actuator 58 operative to independently tilt each reflector element 56 into a desired spatial orientation to steer a beam impinging thereupon to a selectable location on substrate 14.

In accordance with an embodiment of the invention, the variable deflector assembly 52 comprises an optical MEMs device, or is formed as an array of mirrors tiltable by suitable piezo-electric motors, or is formed as an array of galvanometers, or comprises any other suitable array of independently tiltable reflector devices. In the example configuration of the variable deflector assembly 52 seen in FIG. 1A, a 4×5 array of piezo-electric activated beam steering modules 54 is provided. Any other array, including a suitable quantity of independently tiltable steering modules 54, may be used.

As seen in FIG. 1A, the operation of each beam steering modules 54 is independently controlled, for example, by a servo controller 60 in operative communication with system controller 44. Each beam steering module 54 suitably steers a corresponding beam segment 50 to impinge on substrate 14 at a required location 13, in accordance with a desired design pattern of an electrical circuit to be manufactured. Such design pattern may be provided, for example, by the CAM data file 46 or other suitable computer file representation of an electrical circuit to be manufactured.

Progressing now along the optical path downstream of AOD 30, it is seen in FIG. 1A that beam segments 50 are output from AOD 30 such that they lie in a plane, which is oriented relative to the optical axis of the incoming beam 23. The angles $\theta_n$ at which beam segments 50 are deflected by AOD 30 typically are very small relative to the optical axis of the incoming beam 23, in the order of $10^{-2}$ radians. In order to provide for a more compact system, a beam angle expander, such as one or more telescoping optical elements, schematically represented by lens 60, operative to increase a separation between beam segments 50, is provided downstream of AOD 30.

A linear to 2-dimensional mapping assembly 62 receives beam segments 50, which as noted above lie in a first plane, and directs them to a first parallel beam reflector assembly 64 including an array of beam reflectors 66. The mapping assembly 62 is formed with a plurality of mapped sections 63 each of which is positioned in a suitable spatial orientation so that each beam segment 50 output by AOD 30 which impinges on a given mapped section 63 is directed to a corresponding beam reflector 66, to which it is mapped.

Each beam reflector 66 is set in a suitable adjustable holder enabling its spatial orientation to be independently adjusted respective of other beam reflectors 66. In accordance with an embodiment of the invention, the array of reflectors 66 is arranged to direct the beam segments 50 received from mapping assembly 62 along beam paths 51. It is noted that at least some, and in the embodiment seen in FIG. 1A all, of the beam paths 51 are vertically displaced relative to the plane along which beam 23 propagates. However all of the beam paths 51 generally maintain a parallel orientation between reflector assembly 64 and deflector assembly 52. Thus, the beam segments 50 propagate along parallel beam paths 51 to reach locations lying in a plane that is outside the plane through which beam 23 propagates.

Thus, in an embodiment of the invention as seen in FIG. 1A, before impinging on variable deflector assembly 52, downstream of reflector assembly 64, the beam paths 51 each pass through an array of zoom lenses 68 providing a zoom functionality to control a cross sectional diameter of a beam segments 50, an array of beam shaping lenses 70 providing a beam shaping functionality, and an array of independently controllable beam focusing lenses 72, providing an independent focusing functionality for beam segments 50 in any of the beam paths 51. Each of the beam paths 51 reaches a corresponding beam steering module 54 in variable deflector assembly 52. Beams 50 reaching a steering module 54 are independently steered to address independently selectable locations 13, on substrate 14, by reflecting elements 56.

In the embodiment seen in FIG. 1A the spatial orientation of each reflecting element 56 is independently controlled by a positioning device, including, for example, at least three piezoelectric positioners 58 arranged in a star-like arrangement operative to in the directions indicated by arrow 59. Suitable piezoelectric positioners are described in copending U.S. patent application Ser. No. 10/170,212, filed Jun. 13, 2002 and entitled "Multiple Beam Micro-Machining System and Method", the disclosure of which is incorporated by reference in its entirety.

The zoom functionality may be provided, for example, by moving the array of zoom lenses 68, in which a zoom lens is provided for each beam path 51. While such an arrangement is preferred because the respective zoom lenses may be smaller and less expensive, one or more zoom lenses receiving beams propagating all, or any of several, beam segments 50 may be employed. Typically the lenses in zoom lens array 68 are moved together to ensure that all beam segments 50 generally have the same diameter. In an embodiment of the invention, however, a differential zoom may be applied such that some beams are zoomed by a greater or lesser zoom factor than other beams.

The array of beam shaping lenses 70 provides a beam shaping functionality, for example energy profile shaping. This shaping functionality may be provided using, for example, refractive or diffractive optical elements, as known in the art. In accordance with an embodiment of the invention, different beam shaping attributes are provided by laterally displaced overlapping sub-arrays of lenses or beam shaping elements. Thus, as seen in FIG. 1A, each beam segment 50 passes through one of four side by side optical elements. For each beam path 51, a given first beam shaping function is provided to a beam 50 by a first optical element, a second beam shaping function is provided to a beam 50 by a second optical element, a third beam shaping function is provided to a beam 50 by a third optical element, and a fourth beam shaping function is provided to a beam 50 by a fourth optical element. By suitably moving a holder holding all of the elements in array 70, a given type of optical element is suitably positioned with respect to each of beam paths 51 to provide a desirable beam shaping function to each beam segment 50 passing along a path 51. In the example shown, it is seen for example, that beam segments 50 pass through a second of the four beam shaping elements.

It is a feature of the present invention that the array of independently controllable beam focusing lenses 72 includes a plurality of focusing modules 74, each focusing module focusing a beam segment 50 passing therethrough. Each focusing module 74 includes at least one movable lens 76 that is operated independently of corresponding movable lenses 76 associated with other focusing modules 74. Each beam segment 50 is steered to a selectable location 13 by the beam steering module 54 and is focused onto substrate 14 at the selectable location 13, independently of other beam segments 50. This independent focusing feature, for example, compensates for different focal distances between the focusing module 74 and the selectable location whereat the beam segment 50 impinges on substrate 14. The different focal distances may result, for example, because of beam steering to locations 13 that are at different distances. Consequently, each beam segment 50 can be optimally focused onto the selectable location 13 on substrate 14 independently of other beam segments 50, and several beam segments 50 can each be simultaneously optimally focused to corresponding selectable locations 13.

It is noted that although the zoom lenses, beam shaping lenses, focusing lenses and beam steering modules are depicted in FIG. 1A as being grouped into separate functional assemblies, such grouping has been done merely to simplify description of the key teaching points of the invention. In actuality, the respective zoom, beam shaping, beam focusing and beam steering functionalities may be provided by any suitable grouping or arrangement of optical components, as would be apparent to a person skilled in the art of optical design. Thus for the sake of simplicity, any suitable combination or arrangement of optical components providing at least an independent beam focusing and beam steering functionality for each beam 50 may be referred to as a laser beam module.

In accordance with an embodiment of the invention, as seen for example in FIG. 1A, the number of focusing modules 74 corresponds to the number of beam paths 51, and exceeds the number of beam segments 50 that is output from AOD 30 in response to a given laser pulse 24. This increased number of focusing modules 74 as compared to the number of beam segments 50 provides a redundancy in the number of focusing modules 74. While a first set of focusing modules 74 is operative to independently focus each of beam segments 50 output by AOD 30 and steered to a first set of selectable locations 13, the movable lenses 76 in at least one of the other redundant focusing modules 74 are each moved into a new focus position. Likewise, at least some of the corresponding steering modules 54 are moved to a corresponding new position.

The new focus positions are suitable to focus corresponding beam segments 50 from a subsequent laser pulse 25, as steered to a second group of selectable locations 78. Thus, during the subsequent pulse 25 the acoustic wave 38 in AOD 30 splits beam 23 into different beam segments 50 and deflects the resulting different beam segments 50 so that they pass through other focusing modules 74. The other focusing modules 74 are now suitably configured to deliver the resulting different beam segments 50, in focus, to the second group of selectable locations 78 on substrate 14.

It is noted that AOD 30 has a cycle time which is shorter than the time interval between consecutive pulses 24 and 25 of laser beam 22. In other words, the time required to reconfigure the acoustic wave 38 in AOD 30 to comprise a different composition of frequencies when impinged upon by the laser pulse 25, so as to change at least one of the number of beam segments 50 and the respective directions thereof upon output from AOD 30, is less than the time separation between consecutive pulses 24 and 25 in beam 22. Consequently, the number of beam segments 50 and the direction, $\theta_n$, of each of beam segment 50 can be changed, thereby to select corresponding pairs of beam focusing modules 74 and steering modules 54, in less time than the time interval separating pulses 24 and 25. A preferred embodiment of an AOD 30 outputting a selectable number of beam segments 50, and controlling a direction of each beam segment 50, is described hereinbelow in greater detail with reference to FIGS. 3A–3C.

In contrast to the cycle time of AOD 30 being faster than time intervals between pulses 24 and 25 in beam 22, the respective cycle times of the beam steering modules 52 and the beam focusing modules 74 typically are slower than the time intervals between pulses 24 and 25 in beam 22. This means that the time interval required to reposition the reflector element 56 in the beam steering module 54 or to move a movable lens 76 in the focusing module 74 is greater than the time interval between consecutive pulses 24 and 25. However, because the acoustic wave in AOD 30 can be reconfigured in less time than the time interval between pulses 24 and 25, and because of the redundancy in focusing modules 74 and beam steering modules 54, the AOD 30 can be used to select pairs of focusing modules 74 and beam steering modules 54 (namely laser beam modules) that were suitably repositioned during one or more of the previous pulse intervals.

One benefit of the redundancy in focusing modules 74 and beam steering modules 54 is that it enables an optimum utilization of pulses 24 and 25 in beam 22. While some focusing modules 74 and beam steering modules 54 are actively steering beam segments 50 associated with the first pulse 24 (or first set of pulses), other unused, i.e. redundant, focusing lenses 76 and corresponding reflector elements 56 may be repositioned so that subsequent beam segments 50 passing through their corresponding focusing modules 72 and steering modules 54 will be delivered in focus to different selectable locations 78. By reconfiguring an acoustic wave 38 in the time interval between pulses 24, the AOD 30 is thus used to select suitably positioned focusing modules 74 and beam steering modules 54 to deliver focused beams to independently selectable locations without missing pulses. In accordance with a preferred embodiment of the invention, this repositioning and selection process is performed simultaneously for a plurality of beams.

It is noted that a feature of above described arrangement is the absence of intervening f-θ optics, or other scan optics, between the beam steering modules 54 in the variable deflector assembly 52 and substrate 14. Together, beam segments 50 passing through the collection focusing modules 74 and steering modules 54 cover a target area on substrate 14 that is larger than a sub-target area associated any one pair of a focusing module 74 and beam steering module 54.

Since no intervening f-θ lens is provided downstream of the variable deflector assembly 52, in the system seen in FIG. 1A the focus of each beam segment 50 at substrate 14 is maintained by independently focusing the beam segments 50 upstream of beam steering modules 54. Without upstream focusing before the beam steering modules 54, a beam segment 50 may not be in focus when delivered to at least some selectable locations 13 on substrate 14. Loss of focus results, for example, because the beam segments 50 typically have a finite and small acceptable focus range. Consequently, the pivoting of reflector 56 in steering modules 54 results in a curvature of an uncompensated in-focus field, as described hereinbelow. Thus at some selectable locations on the generally flat surface 17 of substrate 14 there may be a sufficient increase in distance to cause a loss of focus.

Optionally, in accordance with an embodiment of the invention, the focus compensation functionality may be provided at the suitable beam steering module 54, avoiding an upstream focusing module. In such configuration the beam focusing modules 54 are configured to provide a complex spatial positioning operative to simultaneously steer beam segments 50 by pivoting a reflector element 56 and to extend or retract, to shorten or lengthen the optical path, to compensate for focus changes resulting from the pivoting.

The following is a simplified general description of the operation and functionality of system 10: An acoustic wave 38 is generated in crystal 34 in synchronization with the pulses 24 and 25 of beam 22. The acoustic wave 38 is propagated so that a desired acoustic wave structure is present in crystal member 34 at the time a first laser beam pulse 24 impinges thereupon to split beam 23 into beam segments 50. The respective directions of the output beam segments 50 are independently controlled as a function of the frequencies in acoustic wave 38.

Typically, acoustic wave 38 will have several different frequencies, for example, at various spatial segments along its length in crystal 34. The number of beam segments 50, and their respective directions of deflection, are controlled by changing the frequencies in acoustic wave 38. In accordance with an embodiment of the invention, the cycle time of AOD 30 is sufficiently fast such that the acoustic waves 38 can be dynamically reconfigured between pulses 24 and 25 to selectably change the direction of deflection of beam segments 50 between pulses 24 and 25, without skipping pulses or loosing energy. It is noted that an acoustic wave having a wave structure suitable to split beam 23 and selectable direct each of the resulting beam segments needs to be generated for each of the pulses 24 and 25.

Each beam segment 50 is deflected at a selectable angle $\theta_n$, that is a function of the frequency or frequencies of the acoustic wave 38. Because the angles of deflection are relatively small, beam segments 50 preferably pass through one or more angle expander lenses 60. The beam segments 50 impinge on a selected mapped section 63 of mapping assembly 62. Each beam segment 50 is directed by an appropriate mapped section 63 to a corresponding reflector element 66 in parallel beam reflector assembly 64. Each reflector element 66 is suitably tilted to reflect a beam segment 50 along a generally parallel beam path 51. Downstream of the reflector assembly 64, each beam segment 50 preferably passes through a zoom lens in the array of zoom lenses 68, a beam shaping lens in the array of beam shaping lenses 70, and a focusing module 74 in the array of independently controllable focusing lenses 72 to impinge on a corresponding beam steering module 54. Each beam segment 50 is then independently steered by a corresponding beam steering module to impinge on substrate 14 at a selectable location 13. The selectable locations 13 may be selected randomly.

In accordance with an embodiment of the invention, AOD 30 operates at a duty cycle which generally is faster than the pulse repetition rate of laser beam 22. However, the deflection provided by AOD 30 is relatively limited in that it deflects beam segments 50 by relatively small angles of deflection, and in that all of beam segments 50 are output in the same plane.

Conversely, the cycle time required to suitably position movable lenses 76 in focusing modules 74 and reflector elements 56 in beam steering modules 54 typically is greater than the time separation between adjacent pulses 24 and 25 defining laser beam 22. Since each reflector element 54 may be tilted over a relatively large range of angles, preferable in 2-dimensions, a laser segment 50 impinging on the reflector element 54 may be delivered to cover a relatively large spatial region. It is noted however, that in accordance with an embodiment of the invention, the spatial region addressed by a beam segment 50 is relatively large, typically in the order of 100×100 mm. In accordance with an embodiment of the invention, the distance between variable deflector assembly 52 and substrate 14 is sufficiently large to maintain an acceptably low degree of telecentricity, typically in the order of less than about 3°.

In accordance with an embodiment of the invention, each of reflector elements 56 is sufficiently tiltable so that reflector elements 56 in adjacent beam steering modules 54 are operable to deliver beam segments 50 to selectable locations in mutually, at least partially, overlapping regions on the surface of substrate 14. Optionally, the regions merely abut one another, but do not overlap. As a reflector element 56 is tilted into a new spatial orientation, the movable lens 76 in a corresponding focusing module 74 is correspondingly moved to focus a beam segment 50 passing therethrough onto substrate 14. The respective movements of beam steering modules 54 and focusing modules 74 is coordinated to ensure that all of the plurality of beam segments 50 that impinge on substrate 14 are focused, irrespective of any differences in the respective lengths of the respective optical paths.

After completing micromachining operations in a first region covered by beam steering modules 54, substrate 14 and apparatus 10 are mutually displaced so that beam steering modules 54 covers a second region on substrate 14. Upon completion of all desired micromachining operations, substrate 14 is delivered to a subsequent processing stage in an electrical circuit manufacturing process, for example an etching process.

In accordance with an embodiment of the invention, the number of steering modules 54 and the number focusing modules 74 in assembly 52 exceeds the number of beam segments 50 into which laser beam 23 is split by AOD 30. During an initial time interval, beam segments 50 impinge on a first portion of the beam steering modules 54 and a first portion of focusing modules 74, but not on other, redundant, steering modules 54 and focusing modules 74. The initial time interval is also used to reposition the remaining, redundant, beam steering modules 54 and focusing modules 74 which do not receive a beam segment 50 during the initial time interval.

During a subsequent time interval between next adjacent pulses 24 and 25, beam segments 50 are deflected by AOD 30 to impinge on at least some of the beam steering modules 54 and focusing modules 74 which did not receive beam segments 50 during a previous time interval. The beam steering modules 54 and beam focusing modules 74 employed in the subsequent time interval, having been repositioned in the previous time interval, are now suitably repositioned to deflect corresponding beam segments 50 onto the substrate 14. During the subsequent time interval at least some of the beam steering modules 54 and focusing modules 74 that are not impinged on by a beam segment 50, possibly including beam steering modules 54 and focusing modules 74 that were used in the previous time interval, are repositioned for use in a further time interval. This process of repositioning beam steering modules 54 and focusing modules 74 that are not used during a given time interval is repeated. It is appreciated that in accordance with an embodiment of the invention, beam segments 50 will typically be steered to the same location during several pulses, until the micromachining operation is completed at that location. Only after completion of the micromachining operation will the beam segment 50 be redirected by AOD 30 to a different pair of focusing modules 74 and beam steering modules 54 to perform a micromachining operation at a new selectable location 78.

Stated generally, it may be said that concurrent to beam segments 50 from a first laser pulse impinging on selected focusing modules 74 and beam steering modules 54, other focusing and beam steering modules are concurrently repositioned to receive beam segments 50 from subsequent beam pulses.

Typically the time interval required to reposition a reflector element 56 in a beam steering module 54, or to move a movable lens 76 in a focusing module 74, is in the order of between about 2–20 milliseconds, corresponding to between about 40–400 pulses of a 20 KHz Q-switched laser. This relatively long period, which exceeds the time interval between laser pulses 24 and 25, is used to ensure stabilized beam pointing and beam focusing accuracy. Additionally, the use of multiple beam steering modules 54 and multiple focusing modules 74 ensures a redundancy which minimizes the loss of pulses from moving movable lenses 76 to focus beam segments or from repositioning reflectors 56 to steer the beams. It is appreciated that in order to increase the speed of the apparatus 10, and to provide a controlled dosage of energy in each beam segment 50, it may be necessary or desirable to have more than one beam segment 50 simultaneously impinge on the surface of substrate 14 at the same location. In such an arrangement, multiple beam segments 50 are each individually deflected to impinge on separate focusing modules 74 and beam steering modules 54, and the respective beam steering modules are each oriented to direct the beam segments 50 to impinge on substrate 14 at the same location.

Figure 2A:
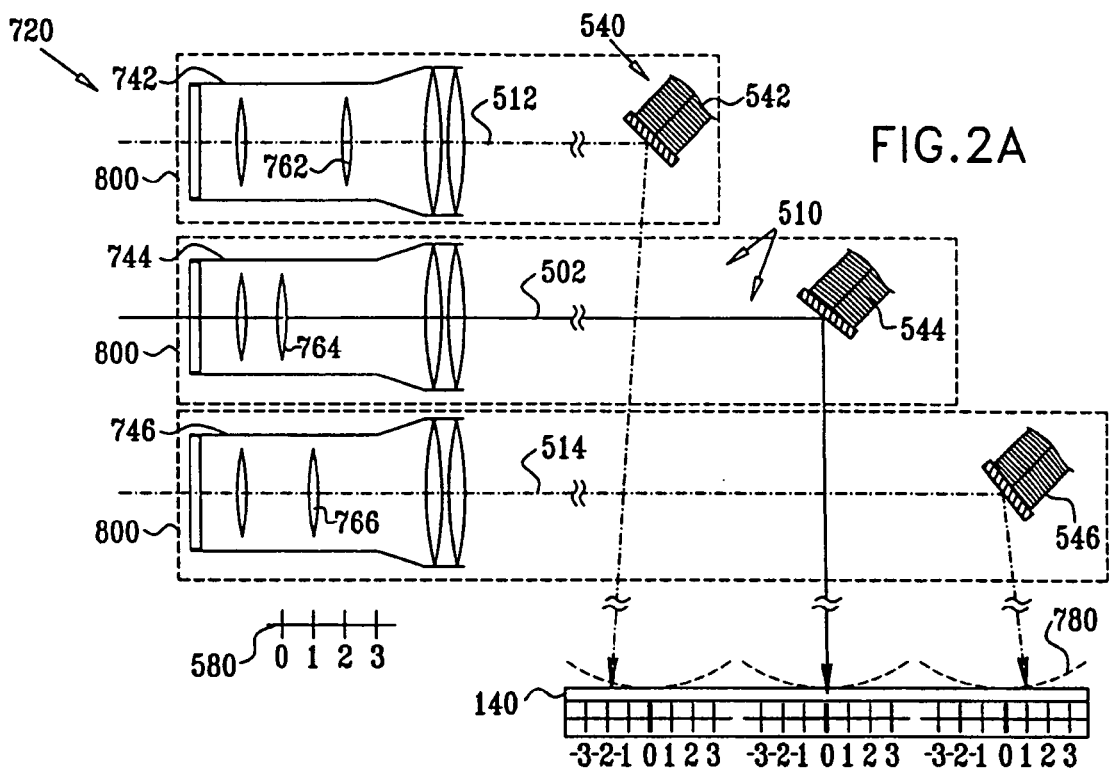
FIGS. 2A–2C are simplified side view illustrations showing operation of a portion of the apparatus of FIG. 1A in three different operative orientations.
Figure 2B:
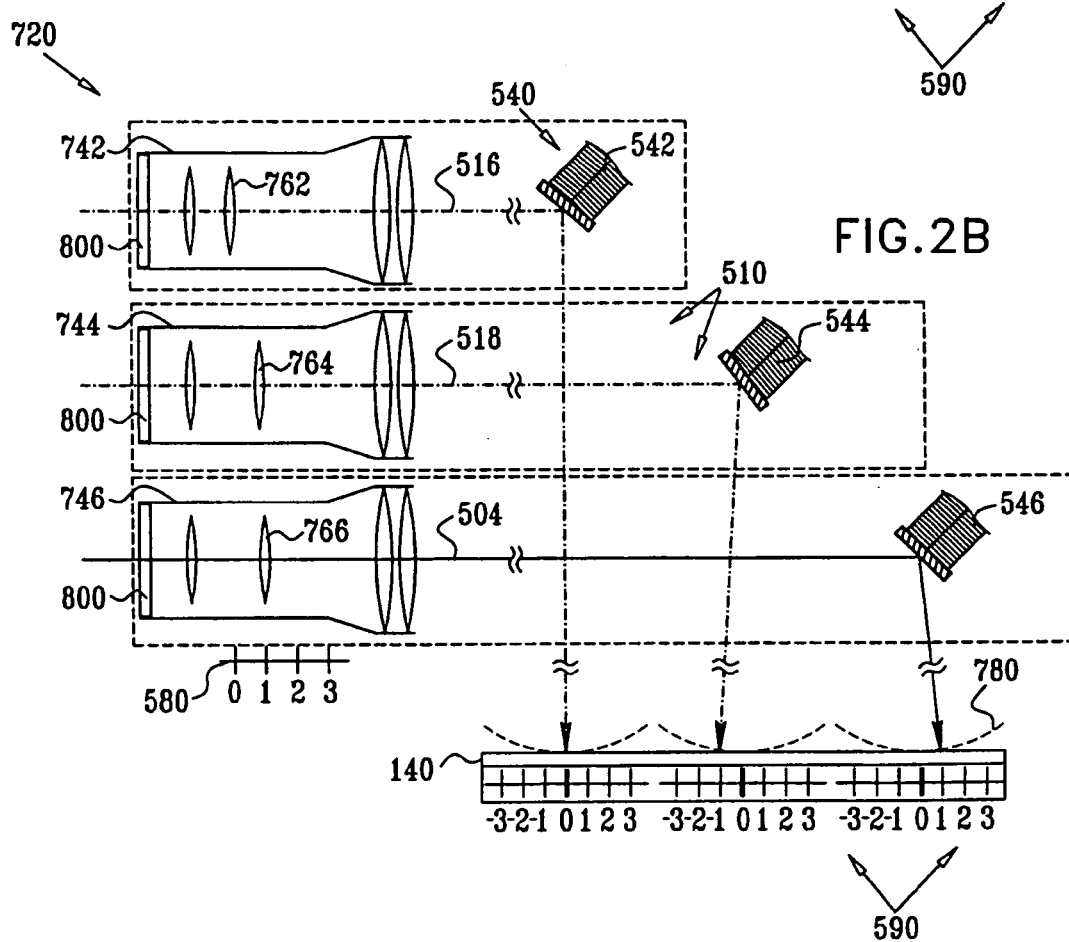
Figure 2C:
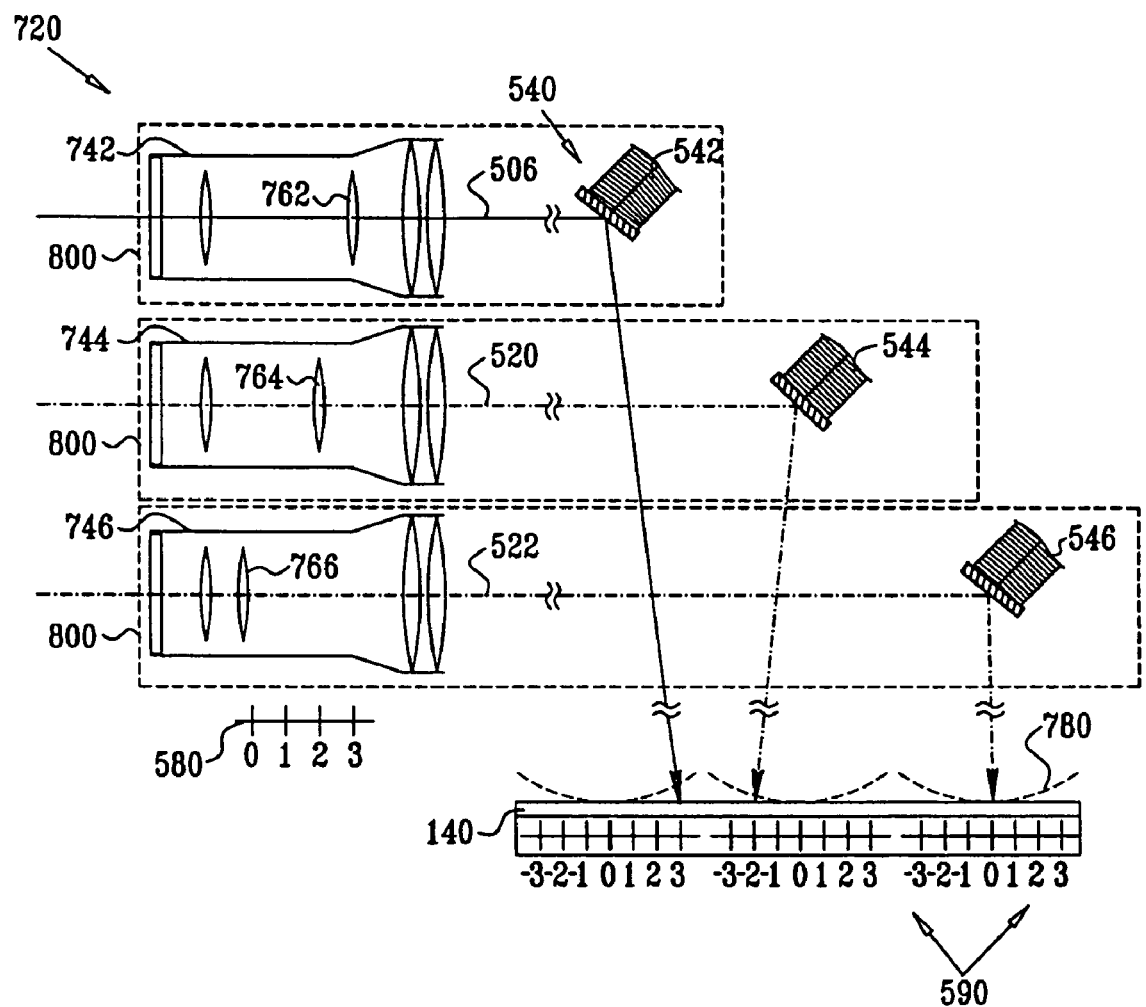

Reference is now made to FIGS. 2A–2C which are simplified side view illustrations showing operation of a an array of independently controllable beam focusing lenses 720, corresponding to a portion of the array of independently controllable beam focusing lenses 72 in the apparatus of FIG. 1A, and an array of independently controllable beam steering modules 540, corresponding to a portion of the variable deflector assembly 52 in the apparatus of FIG. 1A, in three different operative orientations. Array 720 includes three independently controllable focusing modules 742, 744 and 746 respectively. Each focusing module includes an independently movable focusing lens, designated by reference numerals 762–778 respectively. Array 540 includes three independently beam steering modules 542, 544 and 546 respectively. Each beam steering module includes an independently movable reflector element. An assembly including a beam focusing module and a corresponding beam steering module operating in coordination may be considered a laser beam module, designated by reference numeral 800.

Beam paths, generally designated 510, are shown passing through each of focusing lenses 742, 744 and 746 and impinging on the reflector element of a corresponding beam steering module 542, 544 and 546. In FIGS. 2A–2C only one beam segment, designated by a reference numeral 502, 504 and 506 is shown in each of FIGS. 2A, 2B and 2C, respectively, –2C as occupying a beam path 510. This excess of focusing modules and beam steering modules relative to beam segments 502, 504 and 506 corresponds to a redundancy of focusing modules and beam steering modules, as described hereinabove with respect to FIG. 1A. The empty beam paths, designated by a reference numeral 512–522, are shown as broken lines, while the beam segments 502–506, are shown in each of FIGS. 2A–2C as a solid line. Each of the beam segments 502, 504 and 506 impinges on a substrate 140, corresponding to substrate 14 in FIG. 1A, at a randomly selectable location.

In FIGS. 2A–2C a first scale 580 is shown beneath focusing modules 742–746. This scale includes 4 gradations and indicates a relative position of independently movable lenses 762–778 in focusing modules 742–746 for focusing beam segments 502, 504 and 506 onto substrate 140.

A second group of scales 590, each including 7 gradations (0±3), indicates a location of beam segments 502–506 on substrate 140, within a range of possible selectable locations. The number of gradations shown in the scales 580 and 590 in FIGS. 2A–2C is arbitrary. The number of gradations seen in scales 580 and 590 has been chosen for clarity and simplicity in teaching the invention. In actuality, beams 502–506 may be positioned at any number of a greater or lesser number of possible selectable locations on substrate 140, and lenses 762, 764 and 766 may have a corresponding greater or lesser number of possible positions as necessary to focus a beam to possible selectable locations. Moreover, inasmuch as FIGS. 2A–2C are front views, it is noted that the selectable locations typically are located in a two dimensional area on substrate 140, and that, accordingly, steering modules 542–546 are operable to steer beam segments 502–506 to any corresponding selectable locations in the two dimensional area.

The centermost location 0 on scale 590 corresponds to the shortest optical path between a focusing module 742–746 and substrate 140, passing via a beam steering module 542–546. As a beam deviates from the centermost location 0 in any direction, the length of the optical path to the surface of substrate 140 increases. A curvature in the uncompensated in-focus field is schematically shown by curves 780, which generally correspond to an equidistant optical path from lens modules 742–746, using the centermost location 0 as a point of reference.

In FIG. 2A, which corresponds to an operational orientation during the first pulse 24 of a laser beam 20 (FIG. 1A), beam segment 502 is reflected by the suitably tilted reflector element of steering module 544 to address the centermost location 0. Inasmuch as the optical path to the centermost location is the shortest optical length of any selectable location addressable by beam segment 502, lens 764 is situated at position 0 (as indicated by scale 580) in focusing module 744 to focus beam 502 onto substrate 140.

At that moment in time represented by FIG. 2A, steering module 542 is oriented to steer beam path 512 to address location –2 on substrate 140. Lens 762 is located at position 2 in focusing module 742 such that a beam segment passing through focusing module 742 along beam path 512 would be focused onto substrate 140 at location –2. Steering module 546 is oriented to steer beam path 514 to address a location 1 on substrate 140. Lens 766 is located at position 1 in focusing module 746 such that a beam segment passing through focusing module 746 along beam path 514 would be focused on substrate 140 at location 1. It is noted that the corresponding positions of the focusing lenses 762, 764 and 766 in the focusing modules 742–746 correspond to an absolute value of the deviation, in any planar direction, of a beam path from the centermost location 0 on substrate 140. Although the respective lens positions, as indicated by gradations in scale 580, are shown as having a linear distribution, it is also noted that in actuality the distribution of lens positions may be uniformly linear or non-linear.

In FIG. 2B, which corresponds to an operational orientation during the second pulse 25 of the laser beam 22 (FIG. 1A), beam segment 504 is reflected by the suitably tilted reflector element of steering module 546 to address the selectable location 1. Lens 772 is situated at corresponding position 1 in focusing module 746 to focus beam 504 onto substrate 140 via the focusing module 546 at selectable location 1. It is noted that beam steering module 546 and focusing module 746 have not moved respective of their positions as depicted in FIG. 2A.

At the moment in time represented by FIG. 2B, steering module 542 has moved independently of steering modules 544 and 546 and is now oriented to steer beam path 516 to address centermost location 0 on substrate 140. Lens 762, which has moved independently of lenses 764 and 766, is located at position 0 in focusing module 742 such that a beam segment passing through focusing module 742 along beam path 516 would be focused on substrate 140 at location 0.

Steering module 544 has also moved, relative to its orientation in FIG. 2A, and is now oriented to steer beam path 518 to address location –1 on substrate 140. Lens 764, which has moved independently of lenses 762 and 766, is located at position 1 in focusing module 744 such that a beam segment passing through focusing module 744 would be focused on substrate 140 at location 1.

In FIG. 2C, which corresponds to an operational orientation during a third pulse of a laser beam 20 (FIG. 1A), beam segment 506 is reflected by the suitably tilted reflector element of steering module 542 to address the selectable location 3. Lens 762 is situated at corresponding position 3 in focusing module 742 to focus beam 506 onto substrate 140 at selectable location 3. Here it is noted that beam steering module 542 and focusing lens 762 in focusing module 742 have been moved respective of their corresponding positions as depicted in FIGS. 2A and 2B.

At that moment in time represented by FIG. 2C, steering module 544 has moved independently of steering modules 542 and 546 and is now oriented to steer beam path 520 to address location −2 on substrate 140. Lens 764, which has moved independently of lenses 762 and 766, is located at position 2 in focusing module 744 such that a beam segment passing through focusing module 744 along beam path 520 would be focused on substrate 140 at location −2.

Steering module 546 has also moved, relative to its orientation in FIG. 2B, and is now oriented to steer beam path 522 to address centermost location 0 on substrate 140. Lens 768, which has moved independently of lenses 762 and 764, is located at position 0 in focusing module 746 such that a beam segment passing through focusing module 746 would be focused on substrate 140 at location 0.

From the foregoing, it is thus appreciated that focusing lenses 762, 764 and 766 in focusing modules 742–746 are moved independently of each other but in coordination with a changing orientation of beam steering modules as needed to steer beam segments to desired locations. This ensures that a beam segment remains in focus on substrate 140, irrespective of an increase or decrease in the length of an optical path as a result, for example, of curvature in an uncompensated in-focus field resulting from beam steering. Focus compensation values, namely the respective positions of a focusing lens in a focusing module for a given spatial orientation of a corresponding beam steering module to address a selectable location on substrate 140, may be stored, for example, in a look up table.

Moreover, inasmuch as the processing of a given location on a substrate may continue over the duration of several pulses, for example during the drilling of a via in a printed circuit board substrate, an optical path may increase in length requiring further focus adjustment. Such change in optical length may be compensated by moving the corresponding focusing lens 762–768 during drilling in order to optimize focusing. Optionally, an active autofocus device may be provided to measure the actual length of a beam path and adjust the location of a focusing lens accordingly. This may also be beneficial, for example, to compensate for height deviations in the surface of a substrate, which may not be, necessarily, uniformly flat.

Optionally, instead of providing a focus compensation functionality by moving movable lenses 762–766, a focus compensation functionality may be provided by suitably extending or retracting beam steering modules 542, 544 and 546. Such extending or retracting compensates for changes in the length of the optical path resulting, for example, from pivoting reflectors 56 (FIG. 1A), or from changes in the depth of a drilled hole. One way to accomplish such focus compensation would be to provide a piezo-electric activator (not shown) operative to suitably extend or retract beam steering modules 542–546 as a unit. Such extension or retraction of the beam steering modules 542, 544 and 546 may affect optical path geometry to an extent that it is necessary to make minute adjustments to the angular orientation of the reflector 76 in order to address a desired location.

Figure 3A:
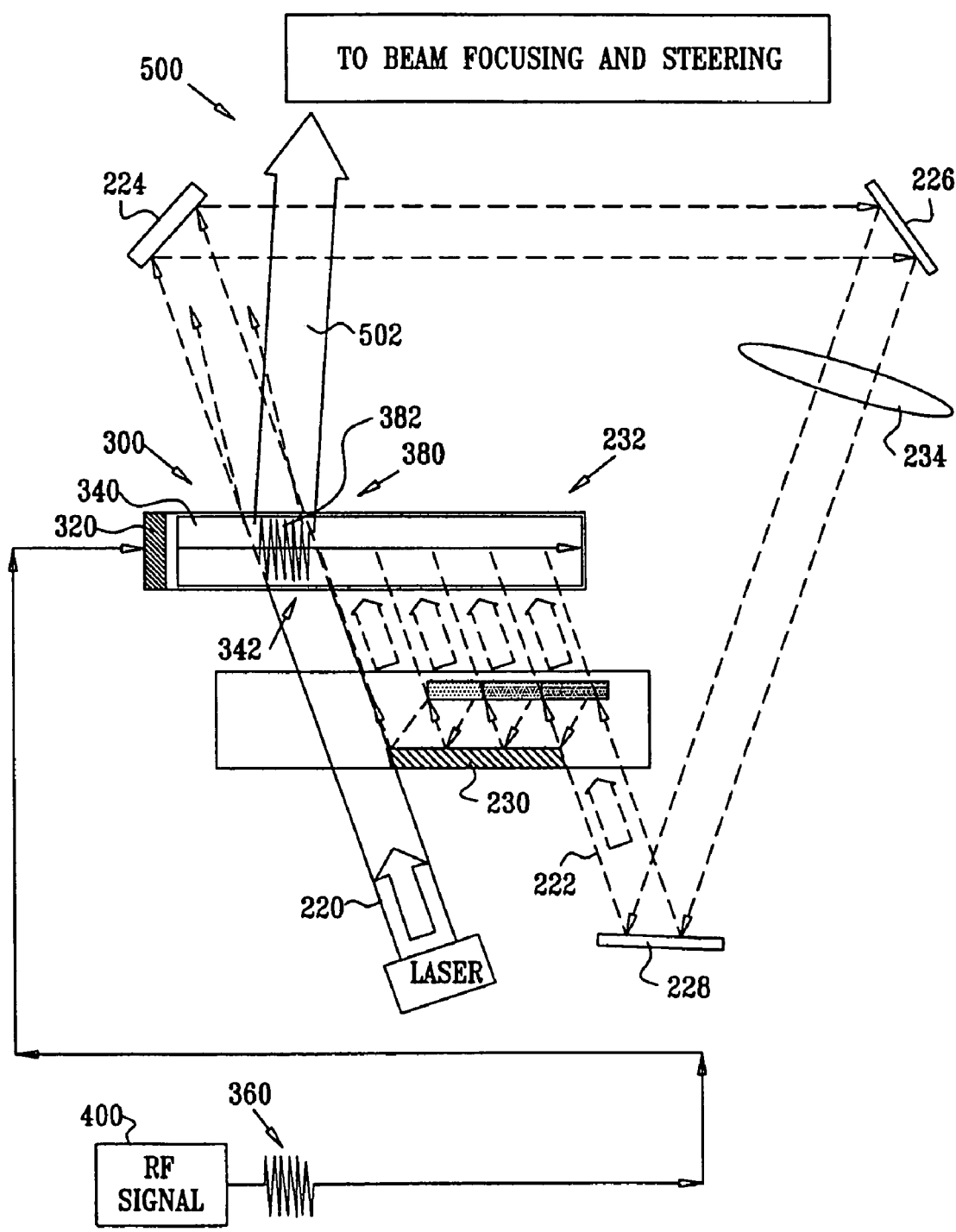
FIGS. 3A–3C are simplified schematic illustrations of an AOD suitable for use in the system of FIG. 1 in accordance with an embodiment of the invention.
Figure 3B:
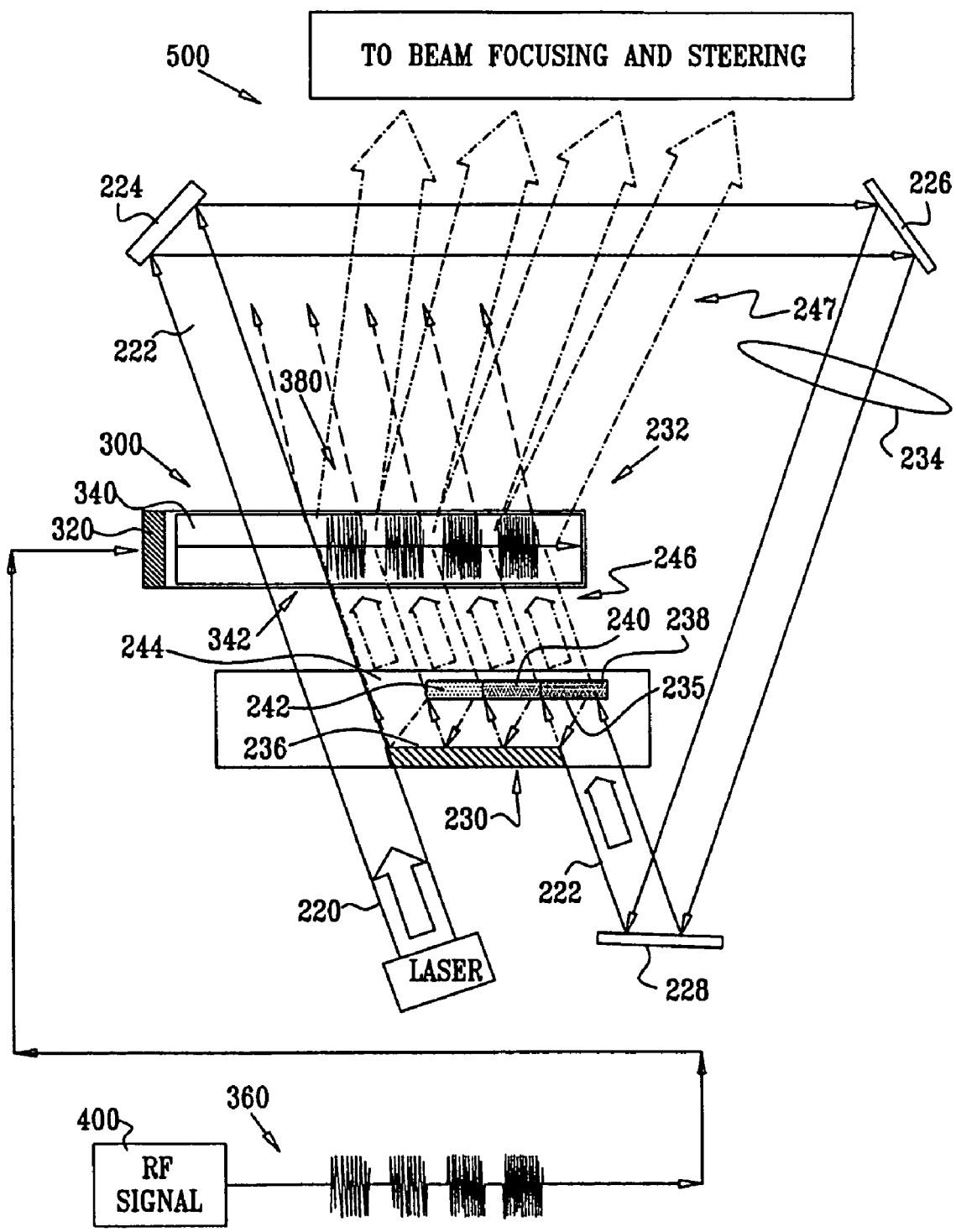
Figure 3C:
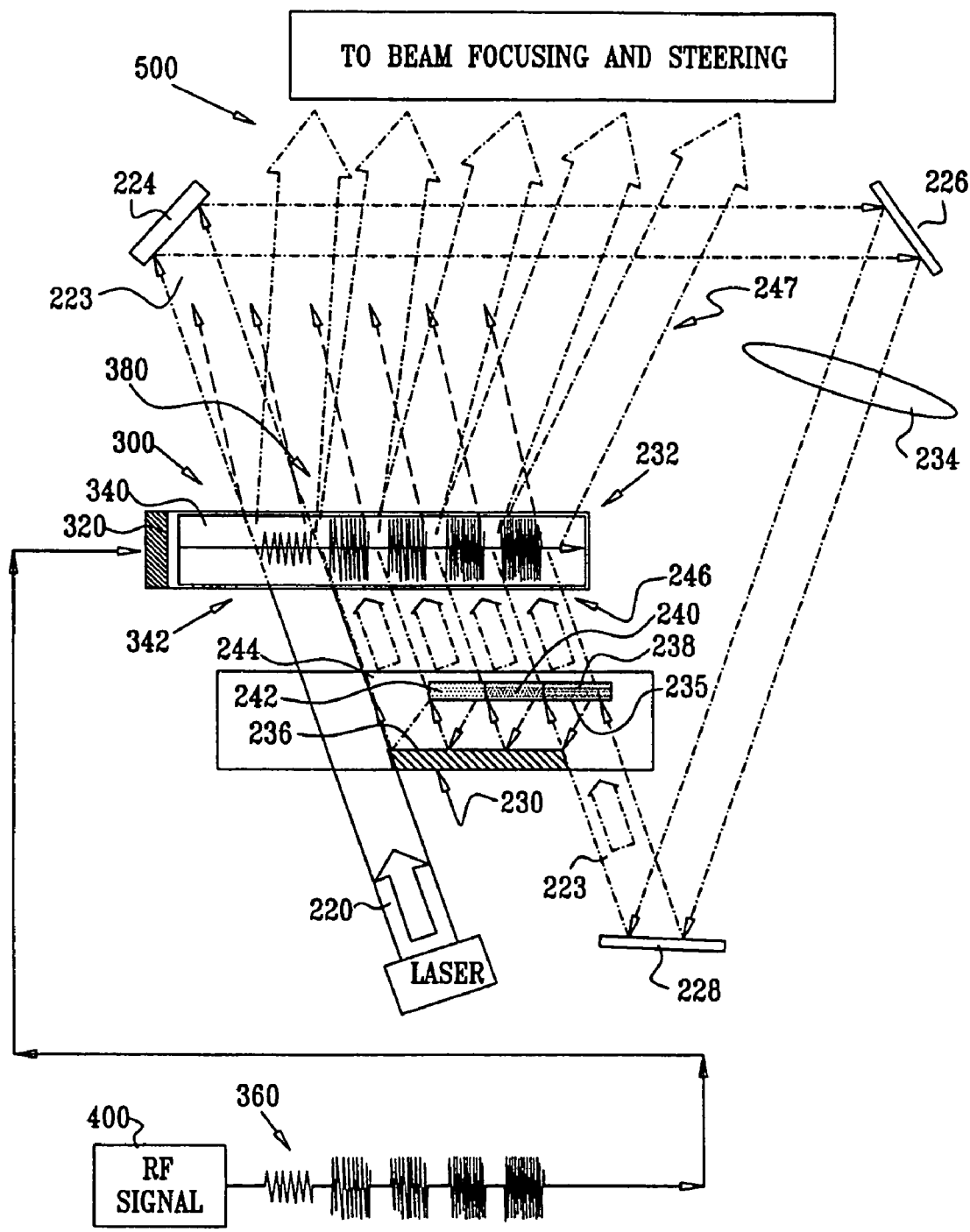

Reference is now made to FIGS. 3A–3C which are simplified schematic illustrations of an AOD 300 suitable for use in the system of FIG. 1A in accordance with an embodiment of the invention. AOD 300 generally corresponds to AOD 30 in FIG. 1A. AOD 300 includes a transducer element 320 and a translucent crystal member 340 formed of quartz or other suitable crystalline material, such as fused silica. A control signal, such as RF signal 360, drives transducer element 320 to cause an acoustic wave, generally designated reference numeral 380, to propagate across crystal member 340. The control signal 360 is provided, for example, by an RF modulator 400 in operational communication with the DDS 42 and the system controller 44 as seen, for example, in FIG. 1A.

It is a feature of AOD 300 that by changing one or more characteristics of acoustic wave 380 propagating through the crystal member 340 in response to a control signal, an input laser beam 220 can be dynamically split into n beams, where $n \geq 1$, and the output direction of each resulting output beam segment 500 can be independently controlled as a function of the acoustic wave frequency. It is noted that in FIGS. 3A–3C, n corresponds to 5 beams. This number n of output beams is arbitrary and AOD 300 can be readily adapted to output a different number of beams as required by a given application.

In accordance with an embodiment of the invention, a laser beam 220 impinges on crystal member 340 at a given preselected location 342. In an acousto-optical deflection device, the efficiency at which a beam is deflected by acoustic wave 380 in the deflector 300 is governed by the acoustic amplitude of the wave. Thus, as seen in FIG. 3A, when a suitably high power acoustic wave portion 382 is located at preselected location 342, substantially all of input beam 220 is deflected as an output beam segment 502.

As seen in FIG. 3B, an acoustic wave is generated such that at the moment that beam 220 impinges on the crystal member 340 at preselected location 342, no acoustic wave is present at preselected location 342. This is accomplished by suitably timing control signal 360. As a result, beam 220 passes through crystal member 340 substantially without being deflected. The pass-through beam 222 is reflected by a set of reflectors 224, 226 and 228 oriented to recirculate the pass-through beam 222 to an array of beam splitters 230 operative to output a given number of beam segments, each of which is passed to the AOD 230 at other preselected locations 232. In accordance with an embodiment of the invention, pass through beam 222 is passed through optics 234, operative, for example, to reshape the pass through beam 222, for example to recollimate the beam, prior to being split and passed through the other preselected locations 232 in AOD 300.

It is seen that the array of beam splitters 230 includes a first reflective surface 235 having a plurality of partially reflective regions located adjacent a fully reflective surface 236. Pass through beam 222 enters the array of beam splitters 230 and impinges on a first partially reflective region 238 configured to pass $1/(n-1)^{th}$ of output beam 222, wherein n is the total number of beams that can be output by AOD 300 (for example, in the embodiment seen in FIG. 3B, n=5). The remaining fraction of the output beam 222 is reflected to the fully reflective surface 236 and then re-reflected to a second partially reflective region 240 configured to pass $1/(n-2)^{th}$ of the beam impinging thereon. The output beam is thus split in a cascade arrangement to form n−1 beam segments which are supplied to AOD 300 for deflection.

In the embodiment of the invention seen in FIG. 3B, n=5. Beam splitter 230 is operative to supply four beam portions 246, each generally having the same profile and having a generally mutually equivalent power level, to crystal member 340 at the other preselected locations 232. The first partially reflective region 238 thus passes 25% of output beam 222 and reflects 75% toward surface 236. The second partially reflective region 240 passes 33.33% of the remaining portion of output beam 222 and reflects 66.67% toward surface 236. A third partially reflective region 242 receives the remaining portion of the pass through beam 222, passes 50% and reflects 50% toward surface 236. A final location 244 passes 100% of the remaining portion of output beam 222.

Each of the beam portions 246 is supplied to crystal member 340 at a corresponding one of the other locations 232. An acoustic wave 380, having frequencies appropriate to independently deflect each output beam segment 247 in a desired direction, is injected into the crystal member 340 in a timed manner to be present at each of the other locations 232 when the beam portions 246 impinge on crystal member 340. It is noted that recollimation of pass through beam 222 and partial splitting and reflection by beam splitter 230 are designed to result in each of beams 500 having a substantially uniform cross sectional configuration and energy density.

The acoustic wave 380 is thus operative to output deflected beam portions 247; each portion being output at a selectable angle as a function of the frequency of the acoustic wave 380 at the moment in time that beam portions 246 interact with the acoustic waves 380, as described with reference to FIG. 1A. It is noted that timing of the acoustic wave 380 is critical and needs to account for the length of the crystal member 340 and the velocity of wave 380 in the crystal, so that an acoustic wave having frequencies appropriate to independently deflect each of beam portions 246 in desired selectable directions is present in the crystal at appropriate respective other locations 232 for each pulse of beam 220.

Referring now to FIG. 3C, it is seen that beam 220 is split into five output beam segments 500. Beam 220 interacts with a relatively low power acoustic wave (seen as having a low amplitude) at preselected region 342 which is operative to deflect 20% of beam 220 and pass 80% as a reduced power pass-through beam 223. The reduced power pass-through beam 223 is reflected by reflectors 224, 226 and 228 oriented to recirculate the reduced power pass-through beam 223 through the array of partial beam splitters 230 operative to output a given number of beam segments, each of which is passed to the AOD 300 at other preselected locations 232. In accordance with an embodiment of the invention, reduced power pass through beam 223 is passed through optics 234, operative, for example, to reshape the reduced power pass through beam 223, for example to recollimate the beam, prior to its being split and passed through to AOD 300.

The array of partial beam splitters 230 includes a first reflective surface 235 having a plurality of partially reflective regions located adjacent a fully reflective surface 236. Reduced power pass through beam 223 enters the array of partial beam splitters 230 and impinges on a first partially reflective region 238 configured to pass $1/(n-1)^{th}$ of reduced power pass through beam 223, wherein n is the total number of beams that can be output by AOD 300. The remaining fraction of the reduced power pass through beam 223 is reflected to the fully reflective surface 236 and then re-reflected to a second partially reflective region 240 configured to pass $1/(n-2)^{th}$ of the beam impinging thereon. The output beam is thus split in a cascade arrangement to form n−1 beam segments which are supplied to AOD 300 for deflection.

In the embodiment of the invention seen in FIG. 3C, n=5 and beam splitter 230 is operative to supply four beam portions 246, each having a generally equal power level, to crystal member 340 at the other preselected locations 232. The first partially reflective region 238 passes 25% of reduced power pass through beam 223 and reflects 75%. The second partially reflective region 240 passes 33.33% of the remaining portion of reduced power pass through beam 223 and reflects 66.67% toward surface 236. A third partially reflective region 242 receives the remaining portion of the reduced power pass through beam 223, passes 50% and reflects 50% toward surface 236. A final location 244 passes 100% of the remaining portion of reduced power pass through beam 223.

It is noted that in accordance with a preferred embodiment of the invention all of the output beam segments 500 generally have the same shape, profile, energy density and fluence among themselves. A fluence property of the output beams segments 500 can be changed by changing the number of output beam segments 500, and the number of output beam segments can be changed by changing the amplitude of a control signal, namely acoustic wave 380, at preselected location 342. As seen in FIGS. 3B and 3C, each of the four or five beams have the same shape, profile and fluence. However, a fluence property of the output beams is changed if one, four or five beams are output.

In accordance with an embodiment of the invention, AOD 300 typically is operated so that all of the beams among themselves are output to have generally a uniform fluence property. In a mode of operation outputting five beam segments 500, acoustic wave 380 is configured such that 20% of beam 223 is deflected at preselected location 342 and 80% is passed through as a reduced power pass-through beam 223. Optionally, however, the acoustic wave 380 may be configured to deflect a portion of beam 223 at preselected location 342 that is greater or lesser than 20%.

For example, in some applications such as laser micromachining copper clad PCB substrates, beams having a greater fluence property are required to micromachine a copper cladding in comparison to an underlying glass epoxy substrate. Typically micromachining copper requires approximately 6× the power required to micromachine glass epoxy substrate. The different power requirements for micromachining copper and epoxy substrate are accommodated by generating one or more first beam segments, for example one beam, each having an energy property suitable for micromachining copper and using that beam to micromachine copper at plurality of locations. Subsequently, laser beam 220 is divided into a greater number of beam segments by AOD 300, for example four or five beam segments depending on the energy requirements, each suitable for micromachining glass-epoxy substrate. The greater number of beam segments are then used to micromachine glass-epoxy substrate where the copper has been previously exposed.

In accordance with an optional embodiment of the invention, it may be desirable to deflect at preselected location 342 substantially less than 20% of beam 223, for example only 4%, and then divide the remaining 96% among the other four beam segments output from AOD 300. This results in the beams having a non-uniform fluence among themselves. In this example, the 4% beam segment would be used to ablate glass-epoxy substrate which can be performed relatively expeditiously. The remaining 96% of beam 223 would then be divided into multiple beam segments, for example four beam segments, each having 24% of the remaining total energy. Assuming that laser beam 220 is of sufficiently high power, these resulting beam segments would be suitable, for example, for micromachining a copper cladding.

It is appreciated that this mode of operation requires a laser source having a suitably high power output to simultaneously produce multiple beams each sufficiently energetic to micromachine copper. Moreover, it assumes that a micromachining operation on glass epoxy can proceed at a rate that is quick enough so that one beam is able to keep up with a greater number of beam segments simultaneously performing micromachining operations in copper cladding.

Alternatively, it may be desirable to output beams having a non-uniform fluence or energy density property by deflecting at preselected location 342 substantially more than 20% of beam 223, for example about 60%. The remaining 40% of the undeflected beam among the other four beam segments output from AOD 300 to generate beam segments having about 10% each of the initial energy. In this example, the 60% fraction of beam 223 is applied to micromachine the copper cladding, and the remaining 4×10% beam segments are used to ablate glass-epoxy substrate. It is noted that the power of a laser source producing beam 220 and the number of beam segments output by AOD 300, and their respective relative energies, may be modified in order to optimize simultaneous micromachining of copper and substrate.

Thus by changing the power characteristic of acoustic wave 380 at preselected region 342, the relative energy density or fluence of a first beam segment 500 can be modified and balanced relative to the fluence of other beam segments. By factoring in the relative power of a laser beam 220 and then modifying the number of beam segments output by AOD 230, and the respective energy distribution between the output beam segments, a micromachining system may be optimized to simultaneously micromachine copper cladding and substrate.

Reference is now made to FIG. 4 which is a flow diagram 600 of a methodology for manufacturing electrical circuits in accordance with an embodiment of the invention. The methodology is described in the context of a process for forming micro vias in a multi layered printed circuit board substrate having a metal foil layer overlaying a dielectric substrate.

The presently described methodology for manufacturing electrical circuits employs a multiple beam micromachining device that is operable to steer a multiplicity of independently focused and independently steered beams operative to deliver laser energy to independently selectable locations on a surface.

In accordance with an embodiment of the invention, a dynamic deflector device, such as an AOD, is operable to selectably provide at least one metal machining beam-segment. In an embodiment of the invention, a beam splitting functionality is also provided by the dynamic deflector. The metal-machining beam-segment has an energy density that is suitable to remove a portion of the metal foil layer, for example by ablation.

Each metal machining beam segment is dynamically deflected to a laser beam module where it is independently focused and independently steered. Each laser beam module may include, for example, an independent focusing lens 74 passing the beam to a separate tiltable reflector element 56 as seen in FIG. 1A. The reflector element is suitably positioned so that the metal machining beam segment is steered to a selectable location on a PCB substrate whereat a portion of the metal foil is removed to expose the underlying dielectric substrate.

While a metal machining beam is removing a portion of the metal foil at a first location, at least one other beam steering module which is not being presently used may be suitably repositioned to remove a portion of metal foil at other selectable locations in subsequent micromachining operations. A subsequent pulse will be deflected by the dynamic beam deflector to impinge on a pre-positioned beam steering module operative to direct a metal removing machining beam to a next location whereat a portion of the metal foil will be removed.

Removal of portions of the metal foil continues at selectable locations until metal foil is removed at all of a desired plurality of locations, as necessitated by an electrical circuit design. These desired locations may include all of the locations to be micro-machined on the substrate, or a subset of all desired locations.

In a subsequent operation, the dynamic deflector device is operated to output at least one dielectric machining beam-segment having an energy property, such as fluence, that is different from the metal machining beam-segment. A beam splitting functionality may be provided by injecting a suitable acoustic wave into an acousto-optical deflector, for example as described with respect to FIGS. 3A–3C. In accordance with an embodiment of the invention, a dielectric machining beam segment has a lower fluence than a metal machining beam-segment. Fluence refers to the beam's energy per unit area (joules/cm$^2$). The energy property of the dielectric machining beam segment is suitable to remove a portion of the dielectric layer, for example by ablation, but is not suitable to remove a portion of the metal foil. This reduced energy level may be achieved, for example, by dividing a laser beam into a greater number of beam segments, for example as described with reference to FIGS. 3A–3C above.

In accordance with an embodiment of the invention, the respective fluence characteristics of beam segments 50 (in FIG. 1A) are controlled by splitting a laser beam 22 into a suitable number of beam segments 50, and by maintaining the diameter of the resulting beam segments 50 irrespective of the number of beam segments, for example using zoom optics such as zoom lens array 68.

Each dielectric machining beam segment is passed to a laser module including focus compensation and beam steering functionalities. Independent focus compensation optics focus the beam at least as a function of a location to be addressed on a PCB substrate to be micro-machined, The beam is steered to that location by a beam steering module associated with the laser beam module. The beam steering module is suitably positioned so that each dielectric machining beam segment is steered to a selectable location whereat a portion of the metal foil has already been removed, to expose the underlying dielectric layer. A desired portion of the dielectric is then removed.

While one or more dielectric machining beams are removing portions of the dielectric at a first set of locations, beam focusing modules and beam steering modules which are not being presently used may be suitably repositioned for removal of dielectric at other selectable locations during a subsequent operation. Thus, a subsequent pulse may be deflected by the dynamic beam deflector to impinge on an already positioned beam focusing module and corresponding beam steering device. Because a reduced energy density is required to remove dielectric, beam 22 may be divided into a greater number of dielectric machining beam segments, compared to metal machining beam segments, thus resulting in a greater system throughput for removing dielectric as compared to removing metal foil. Optionally, by adjusting the amplitude of the control signal in an AOD as described with reference to FIGS. 3A–3C, the AOD may simultaneously output one or more low fluence beams along with one or more high density beams, and use the respective high fluence beam or beams to micromachine copper and the low fluence beam or beams to simultaneously micromachine a substrate material.

Removal of dielectric continues at selectable locations until the dielectric is removed for substantially all of the locations at which metal foil was previously removed. Once this operation is completed, a substrate can be repositioned for micro-machining at a next subsequent portion thereof.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A method of manufacturing an electrical circuit, comprising:
   providing a beam deflector having a plurality of operative regions;
   receiving a laser beam at a first one of the operative regions, said laser beam passing through said beam deflector;
   applying a control input signal to the beam deflector to selectably direct said laser beam to pass through said beam deflector a second time and to be output from a second operative region; and
   delivering at least one of said output beam segments to an in-fabrication electrical circuit substrate to perform an electrical circuit fabrication operation thereon.

2. The method claimed in claim 1, wherein applying the control input signal comprises employing said control signal to generate at least one output segment and wherein applying the control input signal further comprises applying a sequence of pulses, each of the pulses controlling a respective one of the output beam segments.

3. The method claimed in claim 2, wherein employing said control input signal comprises controlling an energy parameter of each output beam segment by varying a characteristic of the control signal.

4. The method claimed in claim 2, wherein employing said control input signal comprises deflecting each output beam segment by a respective deflection angle by varying a characteristic of at least one pulse in a control signal.

5. The method claimed in claim 1, wherein each of the selectable number of output beam segments has substantially the same cross sectional configuration.

6. The method claimed in claim 2, wherein said applying a control input signal comprises directing the output beam segments in respective directions responsive to said control input signal.

7. The method claimed in claim 1, wherein said providing a beam deflector comprises providing a beam deflector having an acousto-optic element, and wherein applying a control input signal comprises generating acoustic waves in the acousto-optic element in response to the control input signal so as to diffract the laser beam in each of the operative regions.

8. A method for manufacturing an electrical circuit substrate, comprising:
   delivering a dynamically split laser beam to an electrical circuit substrate, said delivering including:
   receiving a laser beam at a first one of a plurality of operative regions in a beam deflector; and
   outputting a selectable number of output beam segments from at least another operative region, in response to a control input signal operative to selectably cause said beam to pass through said beam deflector a second time; and
   performing at least one additional electrical circuit manufacturing operation on said electrical circuit substrate.

9. A method according to claim 8, wherein said outputting comprises generating a control input signal having a sequence of pulses, each of the pulses controlling a respective output beam segments.

10. A method according to claim 9, wherein the output beam segments have an energy parameter that is controlled by a characteristic of at least one of the pulses.

11. A method according to claim 9, wherein the output beam segments are each deflected by a respective deflection angle, said deflection angle being controlled by a characteristic of a respective pulse.

12. A method according to claim 8, wherein said outputting comprises outputting a selectable number of output beam segments each having substantially the same cross sectional configuration.

13. A method according to claim 8, wherein said outputting comprises outputting a selectable number of output beam segments at least some output beam segments having a controllable energy parameter.

14. A method according to claim 13, wherein the energy parameter is an energy density.

15. A method according to claim 14, wherein the energy densities of the output beam segments are substantially uniform.

16. A method according to claim 14, wherein the energy densities of the output beam segments are substantially not uniform.

17. A method according to claim 8, said outputting comprises directing the output beam segments in selectable directions in response to the control input signal.

18. A method according to claim 8, wherein said outputting comprises generating acoustic waves in an acousto-optic deflector in response to the control input signal so as to diffract the laser beam at each of the operative regions.

* * * * *